(12) United States Patent
Reed et al.

(10) Patent No.: US 9,673,390 B2
(45) Date of Patent: Jun. 6, 2017

(54) PHASE TRANSFORMATION IN TRANSITION METAL DICHALCOGENIDES

(71) Applicant: The Board of Trustees of the Leland Stanford Junior University, Stanford, CA (US)

(72) Inventors: Evan J. Reed, Stanford, CA (US); Karel-Alexander Duerloo, Palo Alto, CA (US); Yao Li, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 22 days.

(21) Appl. No.: 14/627,296

(22) Filed: Feb. 20, 2015

(65) Prior Publication Data

US 2016/0181516 A1    Jun. 23, 2016

Related U.S. Application Data

(60) Provisional application No. 61/943,057, filed on Feb. 21, 2014, provisional application No. 62/078,332, filed on Nov. 11, 2014.

(51) Int. Cl.
*H01L 45/00* (2006.01)
*G11C 13/00* (2006.01)
(Continued)

(52) U.S. Cl.
CPC ............ *H01L 45/06* (2013.01); *G02F 1/0054* (2013.01); *G02F 1/03* (2013.01); *G11C 13/0004* (2013.01); *G11C 13/047* (2013.01); *H01L 45/1206* (2013.01); *H01L 45/1226* (2013.01); *H01L 45/1233* (2013.01); *H01L 45/142* (2013.01); *H01L 45/143* (2013.01); *H01L 45/144* (2013.01); *G02F 2203/11* (2013.01); *H01L 27/24* (2013.01); *H01L 29/665* (2013.01)

(58) Field of Classification Search
CPC ... H01L 45/06; H01L 45/144; H01L 45/1206; H01L 45/1226; H01L 45/1233; H01L 45/142; H01L 45/143; H01L 29/665; H01L 27/24; G11C 13/0004; G02F 1/03
USPC .......... 257/2, 3, 5, 42, 57, 414; 438/84, 102, 438/156, 157
See application file for complete search history.

(56) References Cited

U.S. PATENT DOCUMENTS 7,307,277 B2* 12/2007 Frey .................... H01L 51/0021
257/40
8,916,914 B2* 12/2014 Kim ..................... H01L 29/151
257/288

(Continued)

OTHER PUBLICATIONS

Eda et al., "Coherent Atomic and Electronic Heterostructures of Single-Layer MoS$_2$", American Chemical Society, 6:8, 2012, pp. 7311-7317.

(Continued)

*Primary Examiner* — Thinh T Nguyen
(74) *Attorney, Agent, or Firm* — Foley & Lardner LLP; Cliff Z. Liu

(57) ABSTRACT

Devices including transition metal dichalcognides and methods of forming and operating such devices are disclosed. In one disclosed method, a layer of a transition metal dichalcogenide is provided, and a phase transformation of at least a region of the layer of the transition metal dichalcogenide is induced.

10 Claims, 11 Drawing Sheets

(51) Int. Cl.
G02F 1/00 (2006.01)
G02F 1/03 (2006.01)
G11C 13/04 (2006.01)
H01L 29/66 (2006.01)
H01L 27/24 (2006.01)

(56) References Cited

U.S. PATENT DOCUMENTS

| 2004/0178403 | A1* | 9/2004 | Ovshinsky | G11C 13/0004 257/4 |
| 2005/0023522 | A1* | 2/2005 | Frey | H01L 51/0021 257/40 |
| 2013/0302593 | A1 | 11/2013 | Coleman et al. | |
| 2014/0183453 | A1* | 7/2014 | Kim | H01L 29/151 257/29 |
| 2015/0155287 | A1* | 6/2015 | Heo | H01L 29/7606 257/29 |

OTHER PUBLICATIONS

Ghorbani-Asl et al., "Electromechanics in $MoS_2$ and $WS_2$: Nanotubes vs. Monolayers," arXiv:1308.1834v1 [cond-mat.mtrl-sci], 2013, pp. 1-19.

Gordon et al., "Structures of Exfoliated Single Layers of $WS_2$, $MoS_2$, and $MoSe_2$ in Aqueous Suspension," The American Chemical Society, Phys. Rev. B, 65 (2002) pp. 125407-1 to 125407-9.

Johari et al., "Tuning the Electronic Properties of Semiconducting Transition Metal Dichalcogenides by Applying Mechanical Strains," The American Chemical Society, 6:6 (2012) pp. 5449-5456.

Voiry et al., "Enhanced Catalytic Activity in Strained Chemically Exfoliated $WS_2$ Nanosheets for Hydrogen Evolution," Nat. Mat. 12 (2013) pp. 850-855.

Yang et al., "Structure of Single-Molecular-Layer $MoS_2$", The American Physical Society, Physical Review B, 43:14, 1991, pp. 12053-12056.

* cited by examiner

PHASE TRANSFORMATION IN TRANSITION METAL DICHALCOGENIDES

CROSS-REFERENCE TO RELATED APPLICATIONS

This application claims the benefit of U.S. Provisional Application No. 61/943,057, filed on Feb. 21, 2014, and U.S. Provisional Application No. 62/078,332, filed on Nov. 11, 2014, the contents of which are incorporated herein by reference in their entireties.

STATEMENT REGARDING FEDERALLY SPONSORED RESEARCH OR DEVELOPMENT

This invention was made with Government support under contract W911NF-07-2-0027 awarded by the U.S. Army Research Laboratory and under contract N66001-12-1-4236 awarded by the Defense Advanced Research Projects Agency. The Government has certain rights in the invention.

TECHNICAL FIELD

This disclosure generally relates to transition metal dichalcogenides (TMDs) and, more particularly, to phase transformation in TMDs.

BACKGROUND

The discovery of a mechanical exfoliation method for two-dimensional (2D) crystals was a watershed moment in the search for materials for the next generation of electronics and energy production. Among layered crystals amenable to isolation of atomically thin monolayers is a family of TMDs having the chemical formula $MX_2$, where M is a transition metal, and X is S, Se, or Te. A semiconducting subset of TMDs includes those in which the transition metal M is Mo or W (both in Group 6), and has received attention in the pursuit of applications including ultrathin flexible electronics and spintronics. In an energy context, these materials hold promise as hydrogen evolution catalysts when certain features are exposed to a reacting environment.

It is against this background that a need arose to develop the techniques for inducing phase transformation in TMDs and related devices and methods described herein.

SUMMARY

In some embodiments, a method of operating an electronic or optoelectronic device includes: (1) providing a layer of a transition metal dichalcogenide; and (2) inducing a phase transformation of at least a region of the layer of the transition metal dichalcogenide.

In other embodiments, an electronic or optoelectronic device includes: (1) a layer of a transition metal dichalcogenide; and (2) a pair of electrodes connected to the layer of the transition metal dichalcogenide.

In further embodiments, an optical switching device includes: (1) a substrate; (2) a patterned metal layer disposed over the substrate; (3) a layer of a transition metal dichalcogenide disposed over the substrate and adjacent to the patterned metal layer; and (4) an electrical source connected to the layer of the transition metal dichalcogenide.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Figure 1:
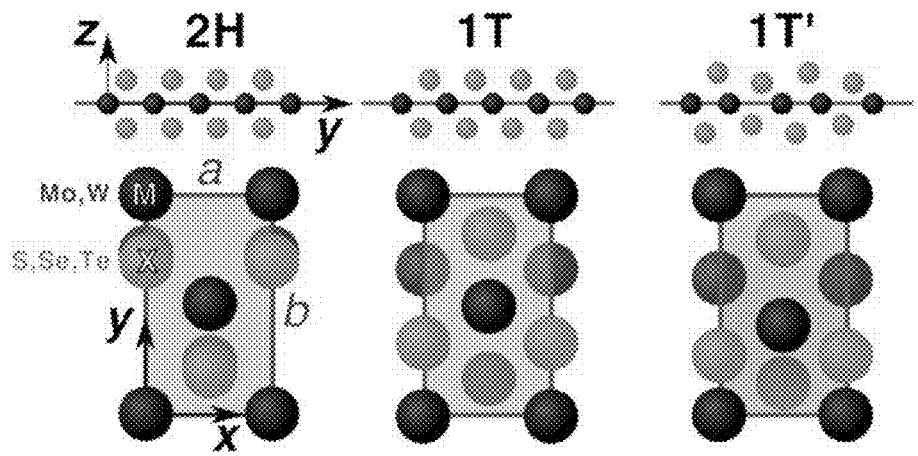
FIG. 1: The three crystalline phases of 2D Group 6 TMDs. Each can be represented in a rectangular unit cell with dimensions a×b. All three phases includes a metal (Mo/W) atom layer sandwiched between two chalcogenide (S/Se/Te) layers. The semiconducting 2H phase can be referred to as the trigonal prismatic structure, and the metallic 1T and 1T' phases are called octahedral and distorted octahedral, respectively. The 1T' phase can be viewed as the 1T phase where the metal atoms have coalesced into zigzag chains along x.

Monolayer TMDs are distinguished from graphene by the potential for multiple structural (e.g., crystalline) phases to exist, although the crystalline phases and properties of monolayers are largely yet to be elucidated. The presence of multiple crystalline phases in chemically exfoliated $WS_2$, for example, can provide effective hydrogen production catalysis, indicating that the understanding and engineering of these phases can have immediate and important applications. In some embodiments of this disclosure, the energetic ordering of monolayer Mo- or W-dichalcogenide phases can be controlled through the application of strain or stress. The appropriate thermodynamic constraints are elucidated for monolayers, which can differ from bulk materials. Density-functional theory (DFT) and hybrid Hartree-Fock/DFT calculations are used to predict that the deformations to yield a phase transition range from about 0.5% to about 15% strain for this set of monolayers, falling within the range of elastic deformations afforded by the exceptional tensile strength of TMD monolayers. In other embodiments of this disclosure, phase transformation in TMD monolayers can be induced through the application of another stimulus or triggering mechanism in place of, or in combination with, mechanical stress or strain, such as through application of a voltage, an electrical current, excess or deficient charges, thermal stimulus, or optical stimulus (e.g., laser). For example, dynamic electrical control of conductivity in 2D materials is one of the most promising schemes for realizing energy-efficient electronic devices. Using DFT, it is determined that a structural semiconducting-to-metallic phase transition in TMD monolayers can be driven by electrical stimuli, including a change of charge density and bias voltage. The dynamical control of this semiconducting-to-metallic phase transition can be achieved by utilizing electronic devices like electrostatic gating employed in a field-effect transistor. These findings open up the possibility of manufacturing ultra-thin, flexible 2D phase change electronic devices with potential for higher energy efficiency than conventional electronic devices. More generally, the potential application space for the disclosed embodiments ranges from catalysis to information storage and nanoscale electronics, among others.

TMDs can be in the form of atomically thin monolayers having the chemical formula $MX_2$, where M is at least one transition metal, and X is at least one of S, Se, and Te. In general, M can be selected from, for example, transition metals of Group 3 (e.g., Sc and Y), Group 4 (e.g., Ti, Zr, and Hf), Group 5 (e.g., V, Nb, and Ta), Group 6 (e.g., Cr, Mo, and W), Group 7 (e.g., Mn and Re), Group 8 (e.g., Fe, Ru, and Os), Group 9 (e.g., Co, Rh, and Ir), Group 10 (e.g., Ni, Pd, and Pt), Group 11 (e.g., Cu, Ag, and Au), and Group 12 (e.g., Zn, Cd, and Hg). Alloyed forms of TMDs are also encompassed by this disclosure, such as $M_mM'_{1-m}X_2$, where M and M' are different transition metals, and $0<m<1$, $MX_xX'_{2-x}$, where X and X' are different chalcogenides, and $0<x<2$, and $M_mM'_{1-m}X_xX'_{2-x}$, where M and M' are different transition metals, X and X' are different chalcogenides, $0<m<1$, and $0<x<2$. Doped forms of TMDs are also encompassed by this disclosure, such as alkali metal-doped forms of TMDs. More generally, M can be any combination of one or more transition metals, X can be any combination of one or more of S, Se, and Te, and the chemical formula can be represented as $MX_y$, where y is 2 or about 2. Of particular interest in some embodiments are TMDs in which the transition metal M is a Group 6 transition metal (e.g., Mo or W). In addition to TMDs, other two-dimensional materials (e.g., InSe, InTe, GaSe, and GaTe) can exhibit structural phase transitions, and are encompassed by this disclosure.

A special but often overlooked feature of these Group 6 TMD monolayers is that these materials can have more than one possible 2D crystal structure, which sets them apart from other 2D materials like graphene and BN. Intriguingly, one of these structural phases is semiconducting whereas the others are metallic. Co-existence of metallic and semiconducting regions on a monolithic $MX_2$ nanosheet can be used to form electronic devices, and metallic regions can promote catalytic activity leading to hydrogen evolution.

Despite the benefits of doing so, it has thus far proven to be challenging to form a stable metallic phase. Although a metastable metallic phase can be formed, it is uncertain that this phase would persist under realistic operating conditions. One would like to understand under what thermodynamic conditions metallic phases of TMDs are expected to be stable rather than just metastable, so that large areas can be synthesized using chemical growth techniques, like chemical vapor deposition. One would furthermore like to understand what TMD monolayers are nearest phase boundaries at ambient conditions and therefore most amenable to applications involving transformations between phases or mixed-phase regimes.

In this disclosure, DFT-based methods including thermal effects are used to determine the phase diagrams of freely-suspended TMD monolayers as a function of strain. It is determined that equibiaxial tensile strains of about 10-15% are involved to observe the 1T phase for many TMDs, but $MoTe_2$ can transform under considerably less tensile strain, less than about 1% under appropriate constraints. It is further determined that mixed-phase regimes can be thermodynamically stable under certain thermodynamic constraint conditions that are achievable in practice.

Under ambient conditions, Group 6 TMDs (except $WTe_2$) can exist in a bulk crystal structure composed of monolayers where the X atoms are in trigonal prismatic coordination around the M atom. The atomic stacking sequence within a single XMX monolayer is βAβ. In keeping with typical nomenclature, this is referred to as the 2H phase, even though the prefix '2' is irrelevant in monolayers because it refers to a bulk stacking mode. Group 6 $MX_2$ monolayers in the 2H crystal structure typically are semiconducting with band gaps between about 1 and about 2 eV. $2H-MX_2$ materials are promising semiconductors for flexible electronic applications, among others. The 2H crystal structure gives rise to metallic edge states that are associated with electrocatalytic activity. The primitive unit cell of the 2H phase is hexagonal. For reasons of consistency between different phases, the calculations on 2H use a non-primitive rectangular unit cell whose axes align with zigzag- and armchair-directions of the structure. These special axes can be experimentally resolved using second harmonic generation and possibly also using the intrinsic piezoelectricity expected to exist in these materials. FIG. 1 shows the 2H structure within a rectangular unit cell having lattice constants a and b.

When one of the 2H structure's X layers is shifted (for example, βAβ→βAγ), the X atoms are in octahedral coordination around the M atoms, and the crystal becomes metallic. This phase is referred to as 1T and is typically observed in Group 4 and Group 5 TMDs (e.g., $TiS_2$ and $TaSe_2$). Its atomic structure is also shown in FIG. 1. The atomic vibrational normal modes (Γ-phonons) are calculated within the relaxed rectangular 1T unit cell of all six Group 6 TMDs. In all cases, one of the optical phonon modes has an imaginary vibrational frequency. This result indicates that the high-symmetry 1T structure is unstable (saddle point in 18-dimensional atomic potential energy surface), at least in the absence of external stabilizing influences.

Under certain conditions, the Group 6 TMDs have a stable metallic structure with octahedral-like M-X coordination. This lower-symmetry phase, which is referred to as 1T', is a distorted version of the 1T structure. A rectangular (as well as primitive) 1T' unit cell is displayed in FIG. 1. The 1T' phase is observed in $WTe_2$ under ambient conditions, $MoTe_2$ at high temperature, and instances of chemically exfoliated and restacked $MX_2$ monolayers.

Figure 2:
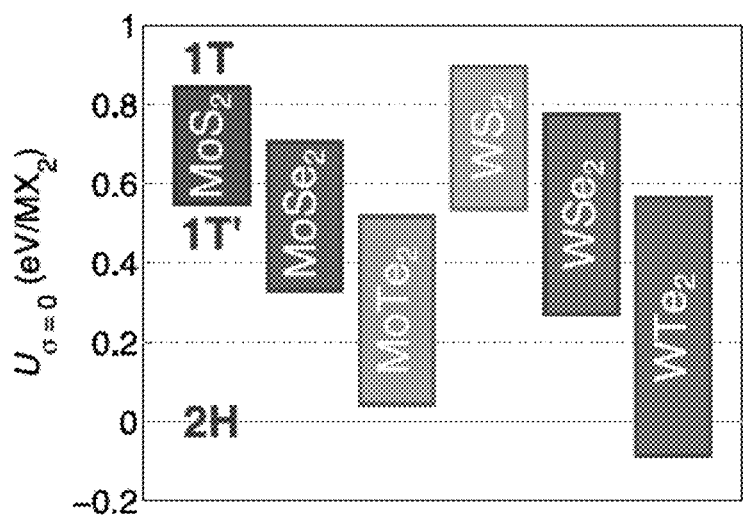
FIG. 2: Ground state energy differences between the 2H, 1T', and 1T monolayer phases of six 2D materials. The energy U is measured per formula unit, $MX_2$. Its value is computed at the equilibrium (zero stress, σ) lattice parameters $a_0$ and $b_0$ for each phase. Because σ=0, these values for U correspond to the enthalphy H. Vibrational energy is not included in these values.

FIG. 2 shows the calculated equilibrium (e.g., stress-free) relative energies of the phases (2H, 1T, and 1T') of all six $MX_2$ monolayer materials. These values are calculated using DFT at the generalized gradient approximation (GGA) level of theory. The results are consistent with the experimental observation for bulk crystals that $WTe_2$ is the exception with 1T' stable under ambient conditions. It is also observed from this data that the energy associated with the 1T to 1T' relaxation is considerable: several tenths of an eV per $MX_2$ formula unit. Although phase transformation between 2H, 1T, and 1T' crystal structures is considered in some embodiments, phase transformation between other crystal structures is also encompassed by this disclosure.

Thermodynamics asserts that a system will seek to minimize whichever thermodynamic potential is appropriate for the prevailing mechanical and thermal boundary conditions. An example of such a thermodynamic potential is the internal energy U. In the low-temperature regime, a system will seek to minimize U when it is constrained to a given shape or volume. Under these conditions, a $MX_2$ monolayer constrained to be described by a rectangular unit cell with dimensions a×b is expected to be in the lower-U phase for those values of a and b. Experimentally relevant phase diagrams of monolayers differ from those of bulk materials at high pressure in at least one important respect: The monolayer can be mechanically coupled to a substrate with friction, allowing the independent control of a and b lattice parameters. Another distinction is that tensile strains are achievable for monolayers, while compressive strains are achievable for bulk materials.

For the six Group 6 $MX_2$ monolayers, GGA DFT is used to calculate the energies U(a,b) of the monolayer crystal structures for a total of 49 pairs of (a,b)-values on a 7×7 grid of around the equilibrium lattice constants $a_0$ and $b_0$. U is obtained after allowing the atoms to relax their positions within each unit cell. Intermediate values for U(a,b) of each phases are subsequently approximated using the Lagrange interpolation method:

$$U(a,b) = \sum_{i,j}\left[U(a_i,b_j)\prod_{k\neq i, i\neq j}\frac{(a-a_k)(b-b_i)}{(a_i-a_k)(b_j-b_i)}\right] \quad \text{Equation 1}$$

Lagrange interpolation is chosen because it contains no physical assumptions about the shape of this energy surface over a large range of tensile and compressive strains. It also greatly facilitates the approximation of local derivatives without suffering from undesirable artifacts often manifested by high-order polynomial methods.

Figure 3:
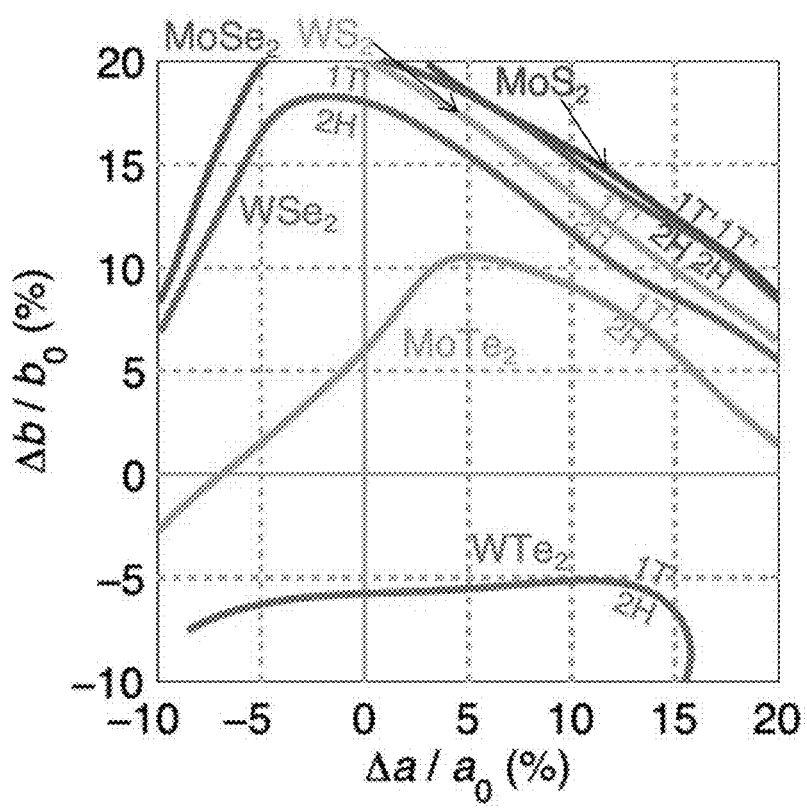
FIG. 3: Intersection contours of the 2H and 1T' energy surfaces U(a,b) when varying the rectangular lattice constants a and b. The lattice constants a and b are represented as percent engineering strains, normalized over the equilibrium lattice constants $a_0$ and $b_0$ of the lowest-energy structure (2H in all cases except $WTe_2$). The lower-energy phase is labeled on each side of the contours.

Using this approach, it is determined that the 2H and 1T' U(a,b) energy surfaces intersect for sufficiently large strains. FIG. 3 shows the contours that follow the intersection of the 2H and 1T' energy in (a,b) space. The changes in a and b to change the relative energies of the 2H and 1T' phases range from about 13% ($MoS_2$) to about 3% ($MoTe_2$). Because many bulk materials begin to dissipate strain energy through fracture or dislocations at strains on the order of 0.1% (roughly $10^{-5}$ eV/atom), these threshold strains may at first appear to be prohibitively large. However, monolayer TMDs are exceedingly strong. For example, $MoS_2$ monolayers can reversibly withstand in-plane tensile stresses up to about 15 N/m, corresponding to about 10% of the material's in-plane Young's modulus. This corresponds to an elastic energy of order 0.1 eV/atom. The local derivatives of U(a,b) indicate that the stresses associated with the 2H-1T' threshold strains are below about 15 N/m for all six Group 6 $MX_2$ compounds, indicating that a transition between 2H and 1T' can be observable below but near the breaking threshold.

From FIG. 3 it is also seen that $WTe_2$, which is usually in the 1T' phase, can be induced into a 2H regime under compression, which is complementary to the other cases where the transformation would go from 2H to 1T' through tension or expansion.

The results shown in FIG. 2 and FIG. 3 derive from the DFT-calculated potential energy $U=U_{crystal}$ and therefore omit the vibrational component of free energy. The vibrational component can be important when the energy difference between phases is less than about 0.1 eV, on the order of $k_BT$. FIG. 2 shows that the 2H-1T' energy offset thus calculated for $MoTe_2$ is sufficiently small (about 43 meV) such that vibrational effects could play a role in the energetic ordering of phases. For a temperature-controlled evaluation, the Helmholtz free energy A(a,b,T) replaces U(a,b) as the relevant thermodynamic potential. This calculation is performed for $MoTe_2$ by treating the DFT-calculated vibrational normal modes as quantum mechanical harmonic oscillators. These effects in $MoTe_2$ are observed to have a considerable impact, even in the idealized T→0 K case because of contributions from the vibrational zero-point energy, which can be regarded as a manifestation of the wavelike nature of the atomic nuclei.

In the case of 2H- and 1T'-$MoTe_2$, a temperature-dependent vibrational free-energy correction is calculated based on the frequency spectrum of the Γ-point phonons for each phase. These phonon frequencies are based on the second derivatives of the crystal energy with respect to the ionic positions within the unit cell. Second derivatives are calculated by applying perturbation theory to the relaxed ionic geometries for all 7×7 (a,b) grid points. The quasi-harmonic vibrational free-energy correction $A_{vib}=U_{vib}-TS_{vib}$ is then added to the potential energy $U_{crystal}$:

$$A = U_{crystal} + A_{vib} \approx U_{crystal} + \sum_i\left[\frac{1}{2}\hbar\omega_i + k_BT\ln(1-e^{-\hbar\omega_i/k_BT})\right] \quad \text{Equation 2}$$

Figure 4:
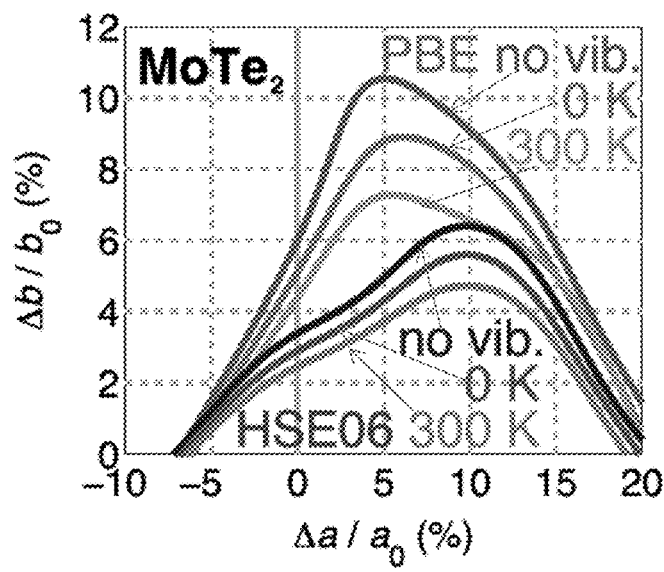
FIG. 4: Vibrational effects and hybrid Density-functional theory (DFT)/Hartree-Fock functionals in $MoTe_2$. This figure shows the intersections of the $MoTe_2$ 2H and 1T' free energies A(a,b,T) using different treatments of vibrational effects and two exchange-correlation functionals. The top curve (PBE, no vibrational effects) corresponds to the $MoTe_2$ contour in FIG. 3. Inclusion of vibrational free energy at 0 K (i.e., the vibrational zero point energy) and at 300 K shifts the onset of the 1T' regime closer to the origin. It can also be seen from this figure that the use of the HSE06 DFT/Hartree-Fock functional in lieu of PBE has a similar effect.

The Lagrange interpolation procedure is then carried out again at intermediate values of a and b. The top three curves in FIG. 4 show that the vibrational correction $A_{vib}$ moves the calculated (a,b)-space free-energy crossing in MoTe$_2$ to smaller strains. Indeed, a 0 K zero-point free-energy correction lowers the threshold strain by up to about 2% in some regions, and increasing the temperature from 0 K to 300 K produces yet another shift of up to about 2% in the same regions.

The results presented above are based on a generalized-gradient Perdew-Burke-Ernzerhof (PBE) functional for electronic exchange and correlation effects. Other exchange-correlation functionals can be used, such as a Hybrid PBE/Hartree-Fock approach known as the Heyd-Scuseria-Ernzerhof HSE06 functional. To explore how HSE06- and PBE-based predictions differ in a MoTe$_2$ context, the $U_{crystal}$ component of Equation 2 is recalculated using the HSE06 functional on the 7×7 grid of PBE-relaxed geometries. (The phonon spectrum was not recalculated for this evaluation) The bottom three curves in FIG. 4 show that use of the HSE06-calculated $U_{crystal}$ brings the 2H-1T' threshold strains even closer to the origin. At 300 K, the transition is predicted to be within about 2% strain of the equilibrium 2H lattice constants.

Consideration of the relevant thermodynamic constraints is provided here for the case of monolayers. The thermodynamic constraint of fixed lattice constants is not a typical one (different from constant volume or area), and is perhaps most applicable when metal atoms are constrained to their positions by substrate friction. At some fixed temperature T, the Helmholtz free energy A(a,b,T) is the thermodynamic potential whose minimization determines which crystal phase (or coexistence of phases) will exist in a crystal possessing a rectangular unit cell with dimensions a×b. However, this fixed-cell constraint need not apply in all conditions, and it is shown how to generalize the MoTe$_2$ results to other cases that are of practical relevance and allow the estimation of the width of any two-phase coexistence regimes in (a,b) space. Two-phase coexistence regions of bulk substances occur under constant volume conditions (e.g., liquid-vapor coexistence) and can be of technological relevance in monolayer materials. For example, a two-phase regime of WS$_2$ can provide enhanced H$_2$ production catalytic activity in WS$_2$ nanosheets.

In a "hydrostatic" isotropic-stress case, the natural thermodynamic potential governing the system is a Gibbs free energy $G_{hydro}$ applying to the "hydrostatic" isotropic-stress case where the surface tensions $\sigma_{xx}=\sigma_{yy}=\sigma$ and $\sigma_{xy}=0$:

$$G_{hydro}(\sigma,T)=A-ab\sigma \qquad \text{Equation 3}$$

The previously independent variables (a,b,T) used in A=A(a,b,T) are now a function of ($\sigma$,T) through the definition of a 2D hydrostatic contour [a,b]=[a($\sigma$,T),b($\sigma$,T)]. This contour is determined directly from the interpolated F(a,b,T) surface and its local derivatives. This isotropic-tension condition is analogous to the isotropic constant-pressure case in three dimensions.

Another relevant case is that of a uniaxial load $F_y=\partial A/\partial b$ along the crystal's y-axis, while the x-face is treated as a free surface (i.e., $\partial A/\partial a=0$). Applying the appropriate Legendre transform to A for this case yields another Gibbs-like free energy $G_y$ that acts as the governing thermodynamic potential.

$$G_y(F_y,T)=A-F_y b \qquad \text{Equation 4}$$

This situation would arise, for example, when a monolayer is suspended over a long linear trench, with its b-axis pointing along the direction that bridges the trench. A force $F_y$ can be applied to the monolayer at the edges of the trench. In this case, the independent variables ($\sigma$, T) are mapped to a uniaxial contour [a,b]=[a($F_y$,T),b($F_y$,T)], derived from the interpolated F(a,b,T) surface and its local derivatives.

Figure 5:
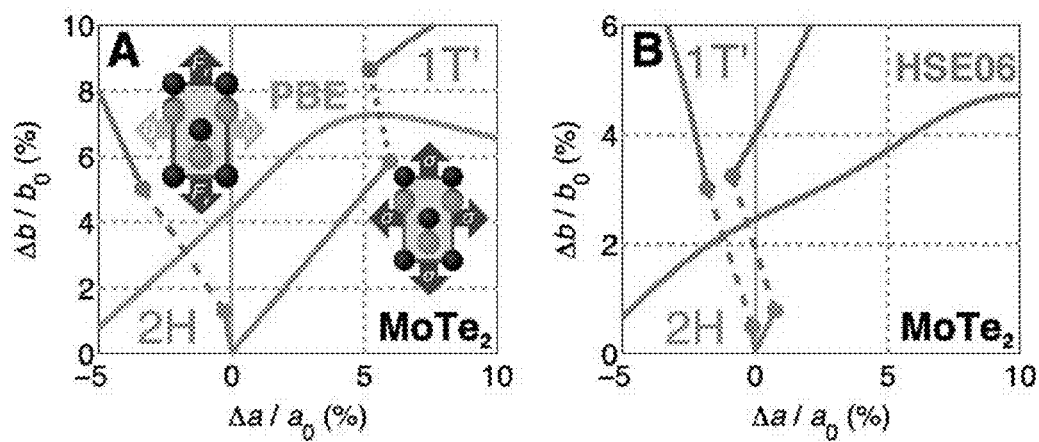
FIG. 5: Load-specific trajectories and transitions of $MoTe_2$ in (a,b)-space at 300 K. Subfigure (a) uses the PBE functional to calculate the crystal energy, whereas the HSE06 functional is used in (b). Starting at their stress-free 2H equilibrium values $a_0$ and $b_0$, the lattice constants a and b evolve in response to progressive application of a uniaxial load (left trajectory in each subfigure) or a "hydrostatic" isotropic tension (right trajectory). At a certain load, the 2H and 1T' thermodynamic potentials cross. When this transition occurs, the lattice constants jump from their 2H to their 1T' values. A coexistence regime is expected to exist in the dashed regions, where increasing the b lattice constant while keeping $F_x$=0 (left) or increasing the area ab under hydrostatic conditions can yield regions of 2H and 1T' in the monolayer. While the solid trajectories appear to be mostly rectilinear, they represent an aggregate of finely sampled data points.

Both the hydrostatic and uniaxial contours are displayed in FIG. 5a (PBE-calculated $U_{crystal}$) and FIG. 5b (HSE06-calculated $U_{crystal}$). When increasing $F_y$ or $\sigma$, at some point the Gibbs free energies of the 2H and 1T' phases cross. When that happens, the result is a discontinuous jump in (a,b)-space from the 2H to the 1T' contour, accompanied by a discontinuous jump in electrical, chemical, optical, magnetic, and other structural and non-structural properties. It is interesting to note that at this transition, any coexistence of both phases ranging from 100% 2H to 100% 1T' is thermodynamically stable. The (a,b)-points at each end of the discontinuity mark the beginning and the end of a coexistence regime that is traversed when gradually increasing the width of the trench (e.g., b is directly controlled while the a-face is still free). This is true because the equality of the two phases $G_y(F_y)$ implies that a free energy-minimizing two-phase common tangent exists in the A(a,b,T) ensemble, where a=a(b,T) such that $\partial A/\partial a=0$. Similarly, FIG. 5 shows that the hydrostatic stress case exhibits a mixed phase region that occurs under a constant area condition, in analog with constant volume for a bulk substance. Such a condition could be achieved by, for example, placing a monolayer over a hole in a substrate and clamping the edges fixed.

Figure 6:
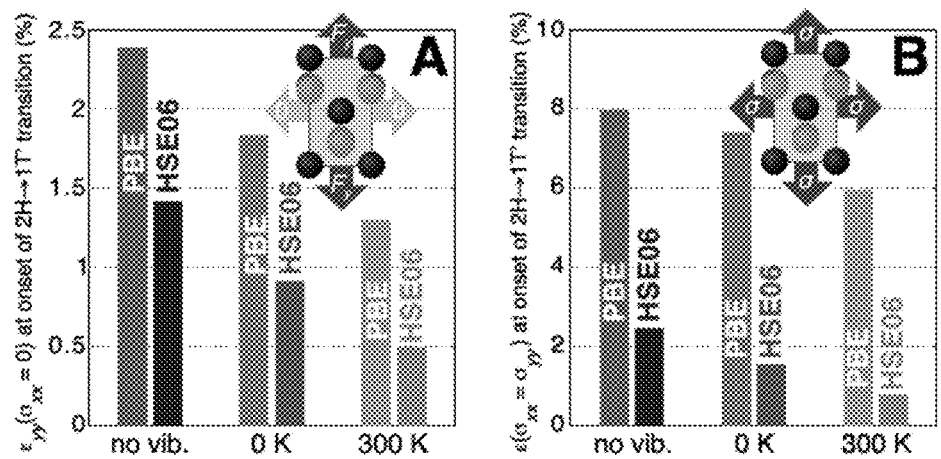
FIG. 6: Strain at onset of load-specific 2H-1T' transitions in 2H $MoTe_2$. This figure is closely related to FIG. 5. The application of a uniaxial load or isotropic tension affects the relative thermodynamic potential of the 2H and 1T' phases. The strains plotted here are the predicted maximum strains in 2H before transformation to 1T' is thermodynamically accessible. The chart in (a) shows the threshold strains $\epsilon_{yy}=\Delta b/b_0$ under uniaxial load. The equibiaxial threshold strains $\epsilon=\Delta b/b_0=\Delta a/a_0$ under isotropic tension are shown in (b). It can be seen that the choice of exchange-correlation functional as well as the treatment of vibrational free energy has an effect on these strain values.

In the uniaxial-load case, the calculated strains $\epsilon_{yy}=b/b_0-1$ to enter the 2H end of this transition regime are shown in FIG. 6a. It is noted that the choice of exchange-correlation functional and the treatment of atomic vibrations have an impact on this number: $\epsilon_{yy}$ ranges from about 0.49% (HSE06, 300 K) to about 2.38% (PBE, no vibrational free energy). FIG. 6b shows that the equibiaxial strain on the 2H end of the hydrostatic transition is similarly sensitive to temperature and electronic exchange-correlation functional. Finally, it is noted that the tensile load-specific transitions discussed here are closest to ambient conditions in MoTe$_2$ because of its small 2H-1T' energy offset.

Additional thermodynamic ensembles can be applicable for monolayers. For example, when a monolayer is weakly bound to a substrate with friction, the atoms are allowed to move to some extent and restricted by contact with the surface. The thermodynamic potential of a TMD monolayer can be some intermediate case between the constant stress case (applicable to a frictionless substrate) and the fixed-(a, b) case where friction is large enough to inhibit any reorientation of the crystallographic unit cell.

The above discussion sets forth a mechanical route for thermodynamically driven phase transformations between metallic and semiconducting crystal structures in Group 6 TMDs. The results show that these mechanical transformations are realizable and particularly accessible in the case of MoTe$_2$.

In general, mechanical stress or strain can be applied to an extent sufficient to induce a phase transformation between metallic and semiconducting phases, by varying (expanding/compressing) either, or both, the rectangular lattice constants a and b, namely along either, or both, the x- and y-directions shown in FIG. 1. The variation of the lattice constants a and b can be represented as percent engineering strains, normalized over the equilibrium lattice constants $a_0$ and $b_0$ in the absence of mechanical stress or strain, where the percent engineering strain of a can be, for example, a non-zero or any other value in the range of about −20% to about 20%, about −15% to about 15%, about −10% to about 10%, about −5% to about 5%, about −3% to about 3%, about −20% to about 0%, about 0% to about 20%, about −15% to about 0%, about 0% to about 15%, about −10% to about 0%, about 0% to about 10%, about −5% to about 0%, about 0% to about 5%, about −3% to about 0%, or about 0% to about 3%, and the percent engineering strain of b can be, for example, a non-zero or any other value in the range of about −20% to about 20%, about −15% to about 15%, about −10% to about 10%, about −5% to about 5%, about −3% to about 3%, about −20% to about 0%, about 0% to about 20%, about −15% to about 0%, about 0% to about 15%, about −10% to about 0%, about 0% to about 10%, about −5% to about 0%, about 0% to about 5%, about −3% to about 0%, or about 0% to about 3%. The magnitudes (in terms of absolute values) of the percent engineering strains of a and b can be the same or different, and the signs of the percent engineering strains of a and b can be the same or different. In some embodiments, the magnitudes and the signs of the percent engineering strains of a and b are optimized along a trajectory in (a,b)-space to induce a phase transformation between metallic and semiconducting phases, such as in terms of reducing or attaining a shortest path to cross an intersection contour of the metallic and semiconducting phases.

By changing a crystal structure from the 2H phase to the 1T' phase (or vice versa), a TMD's electronic structure is modified (e.g., through a discontinuous jump in band gap or other electronic properties) to render it metallic (or semiconducting in the case of a transformation from the 1T' phase to the 2H phase). In addition, other consequences of a structural transformation can be attained. For example, by changing the crystal structure, chemical properties of the TMD also can be modified (e.g., through a discontinuous jump in chemical properties), leading to, for example, different and desirable catalytic activity.

Another advantage of attaining a structural transformation relates to the stability of a resulting metallic phase. Metallic behavior sometimes can be observed when applying mechanical strain to a semiconducting phase (without undergoing a structural transformation), but that behavior can quickly disappear once the strain is removed. A metallic crystal structure, on the other hand, is more stable and can persist for years, even after strain is removed. This renders embodiments of this disclosure applicable to nonvolatile memory applications in which the contrast between semiconducting and metallic phases can be used to store information.

Mechanically-induced, solid-solid phase transformation can be achieved using flexible substrates, indirect substrate methods, gate pull-in methods, epitaxial growth, Atomic force microscopy (AFM) techniques, and other approaches.

For example, flexible substrates can be used in cases where phase transformations should occur in response to a mechanical manipulation of a device. A TMD monolayer can be deposited or otherwise applied on top of a larger, flexible substrate. Upon deformation of this substrate, the TMD experiences a strain commensurate with the substrate's deformation.

As another example, indirect substrate methods can be used to achieve a desired phase transformation. A TMD monolayer can be deposited or otherwise applied on a substrate, which is formed of a material that expands or contracts in response to a non-mechanical stimulus. Examples of such physical effects are: 1) piezoelectricity or piezomagnetism, 2) thermal expansion, 3) magnetostriction or electrostriction, and 4) shape memory alloys with strain hysteresis (e.g., nitinol). In the case of a piezoelectric substrate like lead zirconium titanate (PZT), a voltage can be applied across the substrate, leading to substrate deformation, which leads to TMD deformation, which in turn leads to a phase transformation within the TMD.

Figure 7:
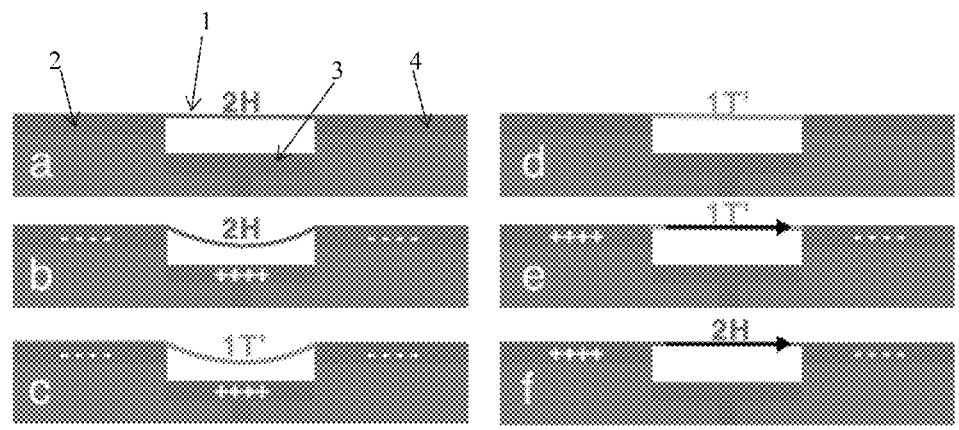
FIG. 7: Gate pull-in method for operating a memory cell.

As another example, strain-driven phase transformations can be obtained in a TMD region that is not attached to a surface using a gate pull-in method, as illustrated for a memory cell in FIG. 7. The memory cell includes a TMD sheet 1 that is suspended over a trench with three electrodes 2, 3, and 4 (part a). By using an appropriately chosen pull-in voltage for the electrodes 2, 3, and 4, an electrostatic attraction between the suspended TMD sheet 1 and the bottom electrode 3 pulls the sheet 1 into the trench (part b), causing tensile strain. After strain-driven transformation (part c), the pull-in voltage is released, and a metastable transformed region persists (part d). This metastable region can be removed by introducing a stimulus that reverses the phase transformation, such as a current between the left and right electrodes 2 and 4 (part e). The result of this operation has reset the TMD sheet 1 to its original phase (part f). The bit state of this memory cell can be measured using a conductivity or resistance difference between the semiconducting and metallic TMD sheet 1.

As another example, a TMD sheet can be forced into specific lattice constants by chemically growing the sheet on top of a mismatching substrate, such as by epitaxial growth. This method yields a phase that is static, rather than dynamic that can be readily reversed. However, this method has the advantage that integrated circuits of metallic and insulating regions can be engineered by using a (lithographic) blueprint on the underlying substrate.

In addition to mechanically-induced phase transformations, phase transformations in TMDs can be induced through the application of another stimulus or triggering mechanism, such as through application of a voltage, an electrical current, or excess or deficient charges. For example, phase transformations can be triggered by electrical stimulus like electrostatic gating, utilizing conventional electronic devices. This electrically-triggered structural semiconducting-to-metallic phase transition in 2D materials involves moving electrons from or within whole materials, allowing controllable transition at small energy cost.

In some embodiments, DFT is used to determine the phase boundaries of two types of monolayer 2D Group 6 TMDs. One is monolayer $MoTe_2$, for which the phase transformation involves the least energy, and the other is monolayer $MoS_2$. The phase boundaries are calculated at constant charge and constant voltage, respectively. It is determined that a surface charge density of about $-4 \times 10^{13}$ $e/cm^2$ or about $8 \times 10^{13}$ $e/cm^2$ is applied to observe the metallic phase in monolayer $MoTe_2$ and a larger value of about $-34 \times 10^{13}$ $e/cm^2$ is applied in the monolayer $MoS_2$ case. For the constant voltage condition, the phase diagram of a monolayer $MoTe_2/MoS_2$ placed on a substrate is calculated, with a bias voltage applied between them. It is determined that a bias voltage of about 0.5~1 V is applied to induce the semiconducting-to-metallic phase transition in $MoTe_2$, and a larger voltage of about 4~5 V is applied to trigger the transition in $MoS_2$. The phase boundary of the metallic-to-metallic phase transition in $TaSe_2$ is calculated and compared with experimental results, and reasonable agreement is observed.

Figure 8:
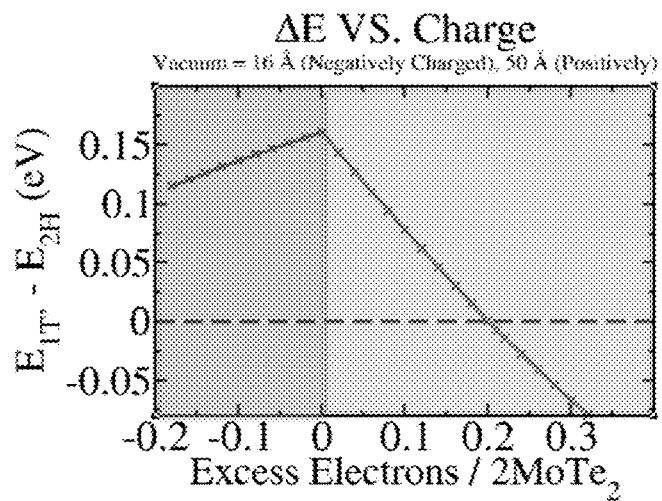
FIG. 8: Energy Difference between 2H-MoTe$_2$ and 1T'-MoTe$_2$ versus the excess/deficient electrons in the unit cell (including 2 MoTe$_2$). Thermal phase transition point is when the unit cell is negatively charged with about 0.20 electrons.

FIG. 8 shows the energy difference between 2H-$MoTe_2$ and 1T'-$MoTe_2$ versus excess charges in the unit cell (including 2$MoTe_2$). When the unit cell is neutral, the 2H-phase has lower energy and is more thermally stable. However, when some excess electrons are added into the cell, namely negatively charging the cell, the energy difference decreases.

When the unit cell is negatively charged with about 0.2 e⁻, the energy difference decreases to zero. When the cell is further charged, the 1T'-MoTe₂ phase has lower energy and becomes more thermally stable. Therefore, the phase transition point calculated using DFT is about 0.2 e⁻/unit cell, corresponding to a surface charge density of about 0.1466 c/m². Negatively or positively charging other TMDs also can be used to attain charge-induced phase transformations, such as charging to a non-zero, surface charge density of up to, or at least, about ±1 c/m², up to, or at least, about ±0.9 c/m², up to, or at least, about ±0.8 c/m², up to, or at least, about ±0.7 c/m², up to, or at least, about ±0.6 c/m², up to, or at least, about ±0.5 c/m², up to, or at least, about ±0.4 c/m², up to, or at least, about ±0.3 c/m², up to, or at least, about ±0.2 c/m², or up to, or at least, about ±0.1 c/m². Also, by alloying different TMD materials, phase boundaries can be engineering to decrease the energy to induce the phase transformation.

Figure 9:
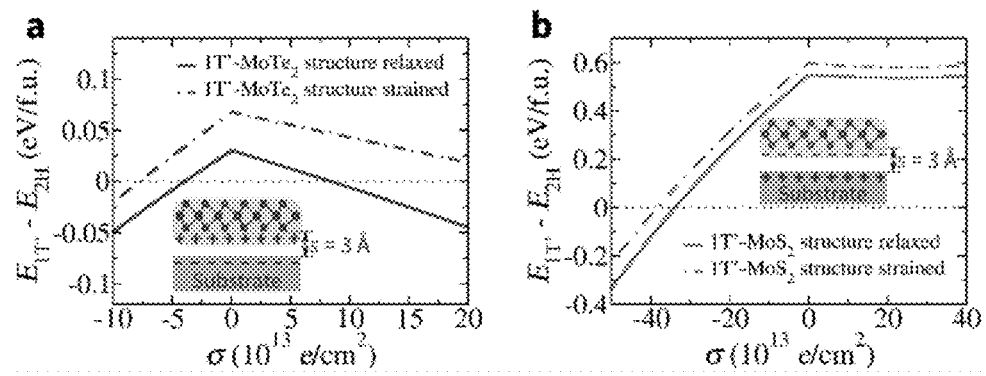
FIG. 9: Electrical charge induced phase transition in monolayer MoTe$_2$ (a) and MoS$_2$ (b). The energy difference between 2H and 1T' phases $E_{1T'}$-$E_{2H}$ changes with respect to the charge density σ. The solid line is the result of structurally relaxed 2H and 1T' phases (stress free). The dashed line is the energy difference between structurally relaxed 2H phase and strained 1T' phase, which is constrained to the computation cell of the same lattice constant of the relaxed 2H phase. It's assumed that the separation between the surface of MoTe$_2$/MoS$_2$ and the electron reservoir (the substrate in the inserted schematic) s equals about 3 Å. a, Semiconducting 2H-MoTe$_2$ is a stable phase, and metallic 1T'-MoTe$_2$ is a metastable phase when the monolayer is electronically neutral or minimally charged. However, 1T'-MoTe$_2$ starts to be more thermodynamically favorable when the monolayer is charged to the threshold value, either positively or negatively. b, Semiconducting 2H-MoS$_2$ is the equilibrium phase when it's electronically neutral, positively charged, and negatively charged before reaching the negative threshold charging point. Once the negative threshold charging value is reached, the equilibrium phase switches to 1T'. The transition from a relaxed 2H phase to a relaxed 1T' phase is more readily induced than the transition to a constrained 1T' phase.

It is thus determined that a transition between semiconducting 2H-TMDs and metallic 1T'-TMDs can be driven by excess electric charge (positive or negative) in a monolayer. FIG. 9 presents an energy difference between these two phases varying with respect to a charge density in the monolayer. One example of excess electric charge in the monolayer is a charge transfer between the monolayer and a substrate, as shown in the inserted schematics of FIG. 9. The substrate serves as an electron reservoir in this example, and it's assumed that a separation between the monolayer surface and the substrate surface is about 3 Å, a normal interface distance. In FIG. 9, the solid lines are stress free cases where both phases are structurally relaxed. This is applicable when the monolayer does not stick to the substrate. Regarding the dashed lines, the 2H phase is stress free, but the 1T' phase is constrained to a computation cell of the same lattice constant as the relaxed 2H phase. This result is applicable when there is a strong interaction between the monolayer and substrate in which the monolayer sticks to the substrate and cannot relax freely.

FIG. 9a shows that semiconducting 2H-MoTe₂ has lower energy and is the equilibrium state when the monolayer is electrically neutral or minimally charged. For the stress free case (solid line), when the charge density is between about $-3.95 \times 10^{13}$ e/cm² and about $8.42 \times 10^{13}$ e/cm² (e is the elementary electric charge), 2H-MoTe₂ is the thermodynamically stable phase. Outside this range, metallic 1T'-MoTe₂ will become the equilibrium state, and a transition from the semiconducting 2H phase to the metallic 1T' phase will occur. For the strained 1T' case (dashed line), a larger charge density is involved to drive the phase transition. FIG. 9b shows that, compared to the transition in monolayer MoTe₂, the transition in monolayer MoS₂ is more difficult to induce and can be achieved by negative charging. If the negative charge density is larger than about $33.82 \times 10^{13}$ e/cm², metallic 1T'-MoS₂ will have a lower energy; otherwise semiconducting 2H-MoS₂ will be energetically favorable. This is consistent with experimental observation that accumulating negative charge in monolayer MoS₂ can trigger trigonal prismatic to octahedral structural transformation. More generally, negatively or positively charging TMDs can be used to attain charge-induced phase transformations, such as charging to a non-zero, surface charge density of up to, or at least, about ±40σ, up to, or at least, about ±35σ, up to, or at least, about ±30σ, up to, or at least, about ±25σ, up to, or at least, about ±20σ, up to, or at least, about ±15σ, up to, or at least, about ±10σ, up to, or at least, about ±7.5σ, up to, or at least, about ±5σ, or up to, or at least, about ±1σ, where σ is $10^{13}$ e/cm².

Figure 10:
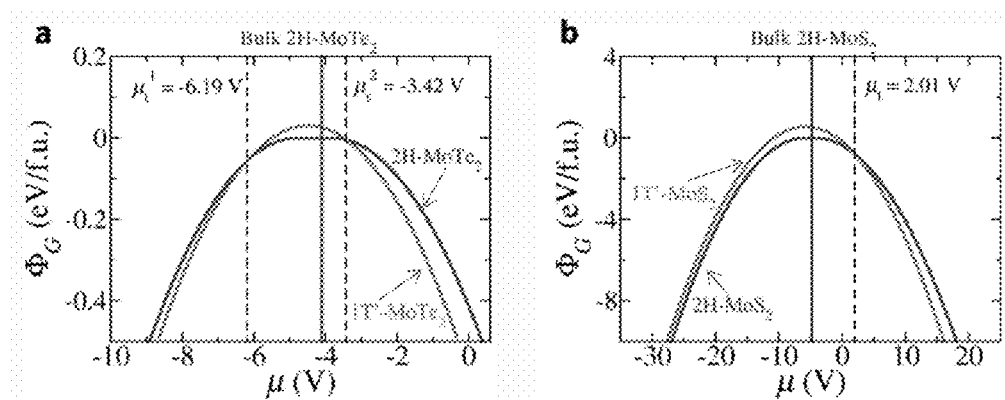
FIG. 10: Phase boundary at constant voltage. The grand potential $\Phi_G$ changes with respect to an electron chemical potential μ of a monolayer. As in FIG. 9, it's assumed that the separation between the surface of MoTe$_2$/MoS$_2$ and the electron reservoir s equals about 3 Å. The solid vertical line is $\mu=-W_{bulk}/e$, where $W_{bulk}$ is the work function of bulk 2H-MoTe$_2$/MoS$_2$. a, Semiconducting 2H-MoTe$_2$ has a lower grand potential and is more thermodynamically stable when its electron chemical potential μ is between the two transition values $\mu_t^1=-6.19$ V and $\mu_t^2=-3.42$ V. Outside this range, 1T' phase will be more stable. b, Semiconducting 2H-MoS$_2$ is the equilibrium phase when the chemical potential is smaller than the transition potential $\mu_t=-2.01$ V; otherwise 1T' phase becomes the equilibrium state.

FIG. 10 presents a grand potential of a semiconducting 2H phase and a metallic 1T' phase and the grand potential's changes with respect to an electron chemical potential. As in FIG. 9, here it's also assumed that a separation between a monolayer surface and an electron reservoir surface equals about 3 Å. FIG. 10a shows that, for a chemical potential between $\mu_t^1=-6.19$ V and $\mu_t^2=-3.42$ V, semiconducting 2H-MoTe₂ has a lower grand potential and is thermodynamically stable; outside this range, metallic 1T'-MoTe₂ has a minimized grand potential and becomes energetically favorable. FIG. 10b shows that, unlike monolayer MoTe₂, monolayer MoS₂ has one transition chemical potential $\mu_t=2.01$ V. When the electron chemical potential is lower than the transition potential, semiconducting 2H-MoS₂ has a lower grand potential and is energetically favorable; otherwise metallic 1T'-MoS₂ has a minimized grand potential and becomes the equilibrium state. One example to test these results is to consider the surface layer of bulk 2H-MoTe₂/MoS₂ as a monolayer placed on the bulk parent substrate. The electron chemical potential of the surface layer is about $-W_{bulk}/e$, where $W_{bulk}$ is the work function of bulk 2H-MoTe₂/MoS₂ (maroon vertical lines in FIG. 10). FIG. 10 shows that the equilibrium state of the surface layer is a 2H phase, consistent with the observation that bulk 2H-MoTe₂/MoS₂ is thermodynamically stable.

In FIG. 10, the top of the curve for semiconducting 2H-MoTe₂ and 2H-MoS₂ is relatively flat, the width of which should equal a band gap width. As a result, the change of the band gap would affect the top of the 2H phase curve. The grand potential values in FIG. 10 are calculated using DFT under the generalized gradient approximation (GGA) for electronic exchange and correlation effects, using the Pedew-Burke-Ernzerhof (PBE) functional. PBE may underestimate the band gap; therefore one would expect the top flat region of the 2H phase to become longer at the right end, which corresponds to the conduction band. This change will shift $\mu_t^2$ of MoTe₂ and $\mu_t$ of MoS₂ to the left for a short distance, but would not affect the existence of the transition chemical potentials.

A discussion of monolayer MoTe₂/MoS₂ on their bulk parent crystals was included in the previous section. In certain applications, monolayer TMDs are placed on various substrates, which can affect an electron chemical potential of the monolayer and may change the equilibrium state of the monolayer. Also, it can be desirable to apply a gating signal to the monolayer TMDs to dynamically control the phase transition between the semiconducting 2H phase and the metallic 1T' phase of Group 6 TMDs. If a bias voltage $V_{bias}$ is applied between the monolayer TMDs and a substrate with a work function $W_{sub}$, one can obtain an equation for $V_{bias}$, $W_{sub}$ and the electron chemical potential of the monolayer μ:

$$V_{bias} = \mu + W_{sub}/e \quad (5)$$

where the monolayer is the reference for $V_{bias}$. For a given $V_{bias}$ and $W_{sub}$, one can obtain μ and then determine which phase is energetically favorable through FIG. 10 (which will change with the separation between the monolayer surface and the substrate surface s). In this manner, phase diagrams can be derived for monolayer TMDs with $V_{bias}$ and $W_{sub}$ as the variables.

Figure 11:
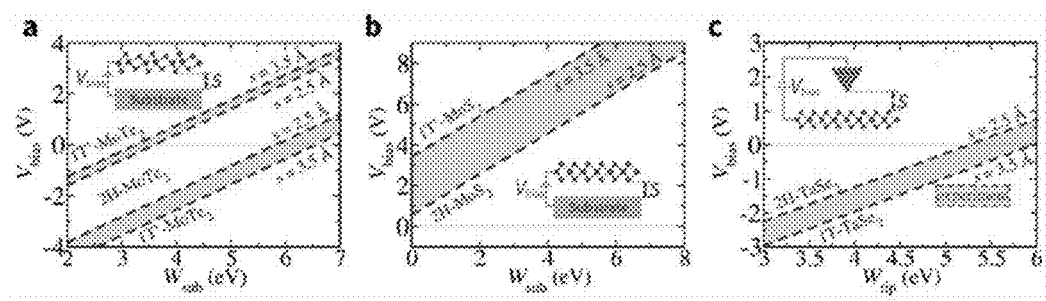
FIG. 11: Phase diagrams of MoTe$_2$ (a), MoS$_2$ (b), and TaSe$_2$ (c). a-b, Plotted are the phase diagrams of monolayer MoTe$_2$ and MoS$_2$ placed on a substrate of a work function $W_{sub}$, with a bias voltage $V_{bias}$ applied between them (see inserted schematic). a, The phase boundary of monolayer MoTe$_2$ depends on the separation between the monolayer surface and the substrate s. For each value of s, there is a set of two boundaries. Inside these two phase boundaries, semiconducting 2H-MoTe$_2$ is more thermodynamically stable; outside, metallic 1T'-MoTe$_2$ is more stable. A larger value of s would result in a wider 2H-MoTe$_2$ region. A typical value of s is between 2.5 Å and 3.5 Å, therefore the phase boundaries would most likely lie in the shadowed region. b, Different from monolayer MoTe$_2$, monolayer MoS$_2$ has one phase boundary. Below the phase boundary, 2H-MoS$_2$ has lower energy and is the equilibrium phase; above the boundary, 1T'-MoS$_2$ is the equilibrium one. It is assumed that the phase boundary most likely lies in the shadowed region for a typical value of s. c, Plotted is the phase diagram of monolayer TaSe$_2$ under a scanning tunneling microscope (STM) tip, with a bias voltage $V_{bias}$ applied between them. The work function of the STM tip is $W_{tip}$. There is one phase boundary in this phase diagram, and the boundary depends on the separation between the TaSe$_2$ surface and STM tip. Above the phase boundary, 2H-TaSe$_2$ is more stable; below the boundary, 1T-TaSe$_2$ has lower energy and is more stable. The shadowed box is the region where the phase transition of TaSe$_2$ from 2H to 1T induced by a STM tip is experimentally observed. The experiment box lies in the region where the phase diagram predicts that a transition from 2H to 1T would occur.

FIGS. 11a and 11b present phase diagrams for monolayer MoTe₂ and monolayer MoS₂, respectively. FIG. 11a shows that, for a specific s, monolayer MoTe₂ has two phase boundaries. Between these two boundaries, semiconducting 2H-MoTe₂ has a minimized grand potential and is thermodynamically stable; outside this range, metallic 1T'-MoTe₂ becomes energetically favorable. The phase boundaries move with the value of s. A larger s will result in a wider region where the 2H phase is the equilibrium state. The separation s depends on the substrate, and a typical value for s is about 3 Å. Therefore, the phase boundaries would most likely lie between the boundaries for s=2.5 Å and the boundaries for s=3.5 Å (the shadowed regions). For a monolayer $MoTe_2$ placed on a substrate, the following considers the case where no bias voltage is applied (the horizontal grey line at $V_{bias}$=0). If the work function of the substrate is between about 3.59 eV and about 5.82 eV (s=2.5 Å), the equilibrium phase of monolayer $MoTe_2$ would be 2H; outside this range, 1T'-$MoTe_2$ is energetically favorable. Most common metal substrates have a work function between about 4.0 eV and about 5.5 eV, like copper (Cu) and gold (Au). Therefore it would be predicted that 2H-$MoTe_2$ is the more thermodynamically stable on these substrates. However, there are some metals with a smaller work function than about 3.0 eV, like lithium (Li). FIG. 11a shows that a Li substrate would favor 1T'-$MoTe_2$ rather than 2H phase.

FIG. 11b shows that, unlike monolayer $MoTe_2$, monolayer $MoS_2$ has one phase boundary. Below this phase boundary, the semiconducting 2H-$MoS_2$ is energetically favorable; above the boundary, the metallic 1T'-$MoS_2$ has a minimized grand potential and becomes more thermodynamically stable. A bigger separation between the monolayer surface and the substrate surface will push the phase boundary toward the 1T'-equilibrium region. FIG. 11b indicates that, without a bias voltage applied, semiconducting 2H-$MoS_2$ is the equilibrium phase on any substrate.

FIGS. 11a and 11b indicate that, in addition to the substrate effect, electrostatic gating also has an influence on the thermodynamically stable phase of monolayer $MoTe_2$ and $MoS_2$. To determine how the electrostatic gating would affect the equilibrium state of the monolayer on a specific substrate, one can draw a vertical line at the work function of the substrate in FIGS. 11a and 11b. Taking a monolayer $MoTe_2$ placed on a Cu substrate for example, which has a work function of about 4.65 eV, if no bias voltage is applied, the semiconducting 2H-$MoTe_2$ will be the equilibrium phase on top of the Cu substrate. A phase transition to metallic 1T'-$MoTe_2$ can be induced either by a positive bias voltage more positive than about 1.06 V (s=2.5 Å) or a negative bias voltage more negative than about −1.17 V (s=2.5 Å). A bigger separation s will increase these transition voltages.

For $MoS_2$, FIG. 11b shows that a positive bias voltage can trigger the phase transition to metallic 1T'-$MoS_2$. If a monolayer $MoS_2$ is placed on a Cu substrate and the separation s=2.5 Å, a positive voltage $V_{bias}$>5.22 V can drive the phase transition. A larger work function $W_{sub}$ and a larger separation s will result in a larger voltage to trigger the transition.

More generally, applying a negative or positive bias voltage to TMDs can be used to attain voltage-induced phase transformations, such as applying a non-zero, bias voltage of up to, or at least, about ±10 V, up to, or at least, about ±9 V, up to, or at least, about ±8 V, up to, or at least, about ±7 V, up to, or at least, about ±6 V, up to, or at least, about ±5 V, up to, or at least, about ±4 V, up to, or at least, about ±3 V, up to, or at least, about ±2 V, or up to, or at least, about ±1 V.

It is noted that calculations of some embodiments of this disclosure are performed at 0 K, omitting the vibrational component of the free energy. Both inclusion of vibrational free energy and a temperature increase can shift the phase boundaries towards the 2H phase region and lower the energy to switch the phase. Therefore, the threshold charge density and bias voltage calculated in some embodiments can represent upper bounds.

Electrically induced structural phase transitions have been observed in other layered metal dichalcogenides. A solid-solid phase transition in a top layer of $TaSe_2$ can be induced by a STM tip. STM images of transition regions are obtained with a negative STM bias voltage from −1.2 V to −1.8V. To provide some insight into these experimental results and validate a total energy calculation approach for a charged monolayer of this disclosure, a phase diagram is plotted for monolayer $TaSe_2$ under a STM tip in FIG. 11c (See Examples for additional details of the calculations of $TaSe_2$). Since a bias voltage is applied between the monolayer and the STM tip, the work function should be that of the STM tip rather than the substrate. FIG. 11c shows that monolayer $TaSe_2$ has one phase boundary. Above the boundary, 2H-$TaSe_2$ has a minimized grand potential and is thermodynamically stable; below the boundary, 1T-$TaSe_2$ becomes the equilibrium phase. The phase boundary depends on the separation between the monolayer $TaSe_2$ surface and the STM tip s. A larger separation will push the boundary towards the 1T'-$TaSe_2$ region. In the experimental results, it's most likely that the separation s is close to about 3.5 Å. Etched iridium (Ir) tips were used in the experiments, and Ir has a work function ranging from about 4.9 eV to about 5.3 eV. Based on the work function range of the Ir STM tip and the bias voltage applied, a shadowed box is drawn in FIG. 11c to display the experimental results of the phase transitions. The experimental box lies right below the phase boundary for s=3.5 Å, in which the phase diagram predicts that 1T-$TaSe_2$ is energetically favorable and a phase transition from 2H to 1T would be induced. This consistency helps to provide insight into the mechanism of the experimental results and also provide validation for the calculation method employed in this disclosure.

By way of summary, some embodiments of this disclosure are directed to a semiconducting-to-metallic phase transformation in monolayer TMDs driven by an electrical stimulus, like electrostatic gating. Some embodiments focus on the phase boundaries in monolayer $MoTe_2$ and $MoS_2$, with the phase transformation in monolayer $MoTe_2$ being easier to induce. A bias voltage of about 0.5~1 V can trigger the phase transformation in $MoTe_2$, while a larger voltage is applied for the transition in $MoS_2$. The threshold bias voltage also depends on a substrate on which the monolayer is placed. For $MoTe_2$, the metallic 1T' phase can be observed even without a bias voltage applied if the substrate has a work function smaller than about 3.5 V. Carefully choosing the substrate can greatly reduce the threshold bias voltage for the phase transformation, and therefore consume much less energy, indicating potential applications in electronics with high energy efficiency. To provide some insight into STM experimental results, a calculation is performed of the phase boundary of metallic-to-metallic phase transition in $TaSe_2$, and reasonable agreement is observed between the calculation results and experimental data.

The understanding of phases and phase boundaries in TMD materials provides a path toward efficient and cost-effective hydrogen evolution catalysis materials. Furthermore, the existence of multiple phases in TMD monolayers has broad applications for electronic, microelectromechanical systems (MEMS), thermal, energy, and myriad other ultra-thin, flexible, energy-efficient, 2D devices which can benefit from the ultra-thin, flexible, transparent nature of the monolayers. For example, the applications of structural semiconducting-to-metallic phase transformation in phase change materials include phase change memories, field-effect transistors, infrared optical switching devices (e.g., as optical shutters, optical modulators, window coatings, or infrared optical nanoantennas), and energy storage devices, among other electronic or optoelectronic devices and applications.

For example, nonvolatile memories are important elements of integrated circuits due to their ability to maintain data even when not powered. Phase change materials are desirable for use in nonvolatile memories. Compared to conventional nonvolatile memory—flash memory, phase change memory has faster switching speed, longer lifetime, and better scalability, and is therefore a candidate to replace flash memory for nonvolatile data storage applications. A typical phase change memory includes at least one layer of a phase change material, which has at least two phases of different resistance. Phase transformation in conventional phase change materials is typically driven by temperature or heat, which is altered by a current pulse. As a result, one drawback of a conventional phase change memory is its sensitivity to temperature. Some embodiments of this disclosure are directed to a phase change memory device in which the phase transformation is electrically driven (or mechanically or non-mechanically driven), rather than temperature or heat, and therefore has reduced temperature sensitivity. Compared to a heat-driven phase transformation, an electrically-driven phase transformation in monolayer TMDs can consume less energy.

Figure 12:
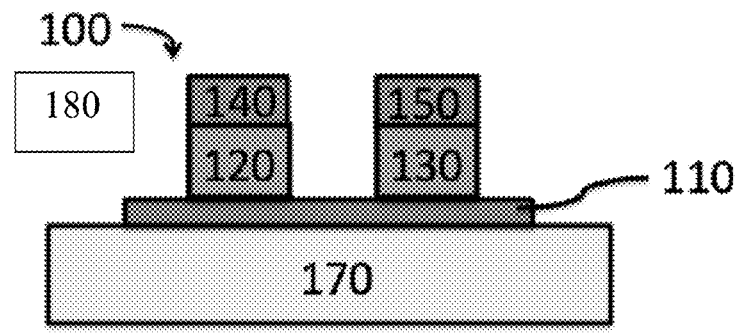
FIGS. 12, 13, and 14: Schematic diagrams illustrating cross-sectional views of various embodiments of a phase change memory cell.
Figure 13:
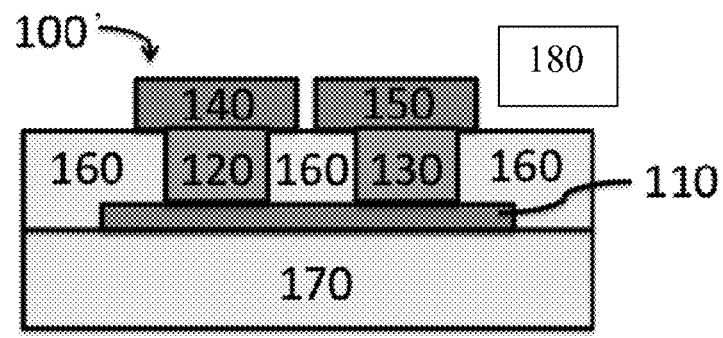
Figure 14:
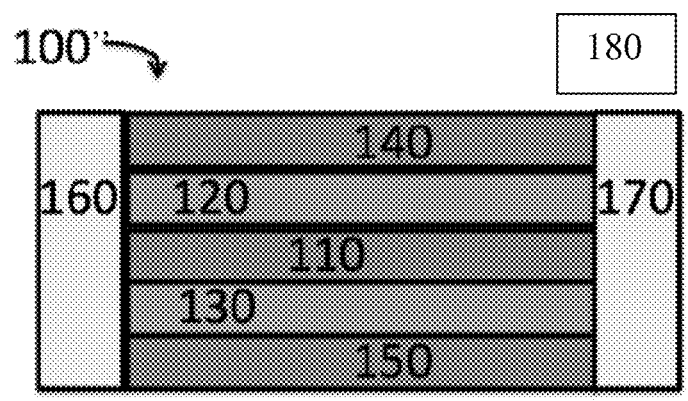

FIGS. 12, 13, and 14 are schematic diagrams illustrating cross-sectional views of various embodiments of a phase change memory cell 100, 100', or 100". As shown in FIGS. 12-14, the phase change memory cell 100, 100', or 100" includes a memory element 110 formed of one or more phase change materials (e.g., one or more monolayer TMD materials) in which information is stored, two electrodes 120 and 130 through which a write voltage can be applied and a read voltage can be applied, and two conductive contacts 140 and 150 which can be used to program or read information stored in the memory element 110. Advantageously, the phase change memory cell 100, 100', or 100" is designed to have reduced temperature sensitivity and consume less energy.

The electrodes 120 and 130 can be connected to provide an electrical signal to the memory element 110 to store information. A voltage potential can be applied to the electrodes 120 and 130 through the conductive contacts 140 and 150, as shown in FIGS. 12-14. Either of, or both, the electrodes 120 and 130 can be connected to an electrical source 180 (e.g., a voltage or current source) through the conductive contacts 140 and 150. The electrodes 120 and 130 and the conductive contacts 140 and 150 can be formed of metals, metal alloys, or other suitable conductive materials.

The conductive contacts 140 and 150 can be address lines, such as column and row lines, which can be used to program or read information stored in the memory element 110.

The memory element 110, in which information is stored, can be formed of, or can include, one or more nonvolatile, phase change materials. These phase change materials can have electrical properties (e.g., resistance) that are changed by an electrical stimulus, such as the application of a voltage potential, an electrical current, or excess or deficient charges. Examples of suitable phase change materials include monolayer TMD materials. Monolayer TMD materials can exist in different crystalline phases, corresponding to different resistance, and their phase transformation can be driven by an applied voltage or excess or deficient charges.

Programming of the memory element 110 to alter its phase can be accomplished by applying a voltage potential to the electrodes 120 and 130, thereby providing a voltage potential across the memory element 110. The voltage potential can cause an electrical current to flow through the electrode 120, the memory element 110, and the electrode 130.

In operation, either of, or both, a voltage and a current signal (e.g., in the form of a pulse) can be applied to the address lines 140 and 150 in order to program data into or read data from the memory element 110. In some embodiments, a voltage potential can cause the memory element 110 to transform from a phase of higher resistance to another phase of lower resistance. A phase or state of higher resistance can represent a "reset" state (e.g., a logic "0" value), and a phase or state of lower resistance can represent a "set" state (e.g., a logic "1" value). The memory element 110 can be composed of a monolayer TMD. When a voltage potential greater than a threshold voltage is applied across the memory element 110 through the electrodes 120 and 130, the monolayer TMD will transform between a phase of higher resistivity (e.g., 2H) and a phase of lower resistivity (e.g., 1T'), and therefore a "reset" state would be altered into a "set" state. In other embodiments, a phase or state of lower resistance can represent a "reset" state (e.g., a logic "0" value), and a phase or state of higher resistance can represent a "set" state (e.g., a logic "1" value). Both "reset" and "set" states can remain without energy (e.g., electrical, optical, mechanical, or a combination) applied to the memory element 110.

The information or data stored in the memory element 110 can be read by measuring the resistance of the memory element 110. In some embodiments, a read current can be provided to the memory element 110 using the electrodes 120 and 130, and a resulting read voltage across the memory element 110 can be compared against a reference voltage using, for example, a sense amplifier (not shown). The read voltage can be proportional to the resistance of the memory element 110. Therefore, a higher read voltage can indicate that the memory element 110 is in a higher resistance state (e.g., a "reset" state), and a lower read voltage can indicate that the memory element 110 is in a lower resistance state (e.g., a "set" state).

Insulating elements 160 and 170 can be included to electrically isolate the memory element 110, the electrodes 120 and 130, and the conductive contacts 140 and 150 from one another and from surrounding elements, as shown in FIGS. 13 and 14.

The phase change memory cell 100, 100', or 100" shown in FIGS. 12-14 can be positioned on a substrate (not shown). The substrate can be formed of a semiconductor, for example.

In some embodiments, the phase change memory cell 100, 100', or 100" can include or can be connected to additional elements or structures. For example, the conductive contacts 140 and 150 can be connected to access devices or circuits. The access devices can include the electrical source 180 (e.g., a voltage or current source), and can be operated (e.g., turned on/off) to access the memory cell 100 in order to perform operations such as data programming. The access devices can be metal oxide semiconductor field-effect transistors (MOSFETs), but also can be devices other than MOSFETs. For example, the access devices can be a bipolar junction transistor (BJT) or a diode, among other types of access devices. In some embodiments, multiple phase change memory cells 100, 100', or 100" can be included, such as in the form of an array.

In other embodiments, information can be stored and read according to optical properties (e.g., absorption, index of refraction, or both) of a memory element. For example, a bit state can be set using a laser pulse that changes a temperature or a charge distribution, and the bit state can be read from a resulting change in optical properties.

Other embodiments relate to energy storage applications. For example, an energy storage device can be charged by transforming from the 2H phase to the 1T' phase, and the stored energy can be released by transforming back to the lower-energy 2H phase.

Other embodiments relate to field-effect transistors incorporating phase change materials. Field-effect transistors are the building blocks of various electronic devices, and the innovations in this field have fueled the exponential advances in the electronics industry. One aspect of the innovations is the shrinking of critical dimensions, which will eventually cease due to the fundamental physical limits of conventional materials. This challenge has motivated the search for alternatives to silicon. Some embodiments of this disclosure are directed to field-effect transistors using phase change materials, like TMDs. Monolayer TMDs can be used in transistors to overcome the scaling limit of conventional transistors. The semiconducting-to-metallic phase transformation can lead to a sharp increase in electrical conductivity; as a result, a sub-threshold swing can be much smaller than a limit of a conventional transistor.

Figure 15:
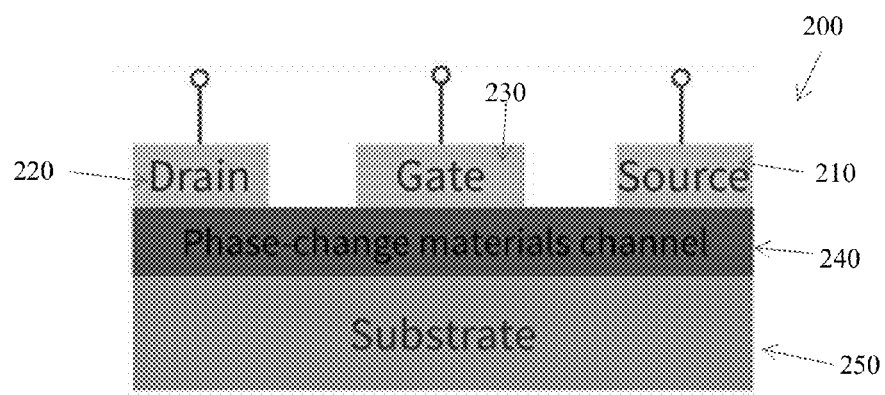
FIG. 15: Schematic of a field-effect transistor using one or more phase change materials. A monolayer TMD is connected between a drain electrode and a source electrode and over a substrate (e.g., a SiO$_2$ substrate) with a gate electrode on top. The portion of the monolayer under the gate electrode can undergo a structural phase transformation from semiconducting 2H phase to metallic 1T' phase, induced by an electrical stimulus.

FIG. 15 illustrates a schematic of a field-effect transistor 200 using one or more phase change materials. A channel 240 is formed from one or more phase change materials, and is connected to three terminals, which are a source electrode 210, a drain electrode 220, and a gate electrode 230. The phase change material channel 240 is disposed over a substrate 250. The phase change material channel 240 can be formed of, or can include, one or more phase change materials, such as doped or undoped TMDs. For example, the phase change material channel 240 can be include a single layer, a few layers, or a bulk form of pristine $MoTe_2$, pristine $MoSe_2$, pristine $MoS_2$, pristine $WTe_2$, pristine $WSe_2$, pristine $WS_2$, alkali metal-doped $MoTe_2$, alkali metal-doped $MoSe_2$, alkali metal-doped $MoS_2$, alkali metal-doped $WTe_2$, alkali metal-doped $WSe_2$, alkali metal-doped $WS_2$, or a combination of two or more of the foregoing. The phase change material channel 240 also can include a single layer, a few layers, or a bulk form of alloys of doped or undoped TMDs. The substrate 250 can be a semiconductor substrate. For example, the substrate 250 can be a p-doped silicon substrate. The substrate 250 can be connected to additional elements or structures (not shown). For example, one or more electrical sources can be connected to the source, drain, and gate electrodes 210, 220, and 230.

Figure 16:
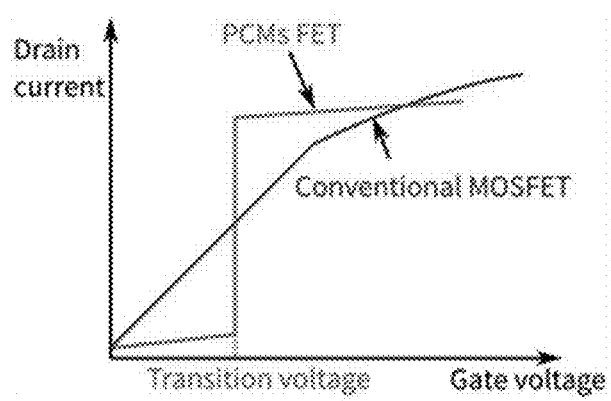
FIG. 16: The sub-threshold behavior of a field-effect transistor using one or more phase change materials (PCMs FET) and a conventional metal-oxide-semiconductor field-effect transistor (MOSFET). The drain current axis has a logarithmic scale.

The gate electrode 230 can inject electrons or holes into the channel 240. At a finite bias, there can be carrier accumulation in the channel 240, and the device 200 is in the OFF state. At a large enough positive or negative bias, when the injected carrier density is large enough to induce semiconducting-to-metallic phase transformation, there is a sharp increase in the channel conductance and the drain current, and the device 200 is turned ON at this threshold voltage/transition voltage. The sub-threshold swing can be smaller due to the dramatically increased channel conductance. FIG. 16 shows the sub-threshold behavior of a field-effect transistor using a phase change material and a conventional MOSFET.

Further embodiments of this disclosure relate to infrared optical switching devices incorporating phase change materials. Infrared optical switching applications include, for example, infrared optical shutters and infrared optical modulators for cameras and missile guidance systems, window coatings, and infrared antenna with tunable resonance. Certain phase change materials can exhibit a change in either of, or both, the transmittance of light and the refractive index at different wavelengths in infrared field when undergoing a phase transformation. This property allows the reversible manipulation of an optical response of various nanostructures in a nonvolatile manner. One type of phase change materials having this property is TMDs.

Figure 17:
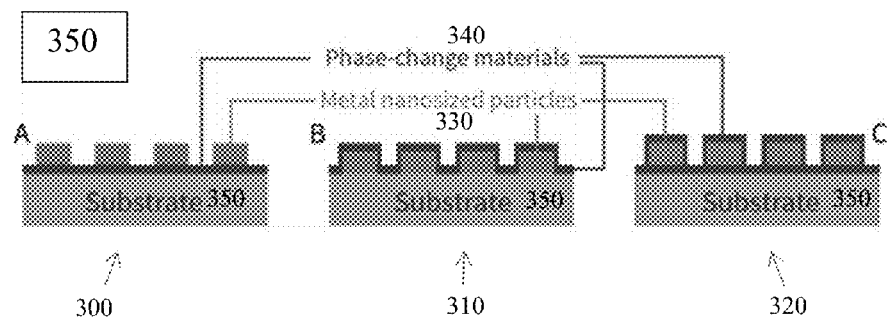
FIG. 17: Schematics of infrared optical switching devices including phase change materials.

FIG. 17 includes schematics illustrating cross-sectional views of infrared optical switching devices 300, 310, and 320 including phase change materials. As shown in FIG. 17, each infrared optical switching device 300, 310, or 320 includes at least one patterned metal layer 330, at least one layer 340 of phase change materials, and a substrate 350. The layer 340 of phase change materials can be formed of, or can include, one or more doped or undoped TMDs. For example, the phase change material layer 340 can include a single layer, a few layers, or a bulk form of pristine $MoTe_2$, pristine $MoSe_2$, pristine $MoS_2$, pristine $WTe_2$, pristine $WSe_2$, pristine $WS_2$, alkali metal-doped $MoTe_2$, alkali metal-doped $MoSe_2$, alkali metal-doped $MoS_2$, alkali metal-doped $WTe_2$, alkali metal-doped $WSe_2$, alkali metal-doped $WS_2$, or a combination of two or more of the foregoing. The phase change material layer 340 also can include a single layer, a few layers, or a bulk form of alloys of doped or undoped TMDs. The metal layer 330 includes nano-sized particles arranged in a desired array with suitable spacings, dimensions, and geometric shapes. A material of the nano-sized particles can be, for example, gold, aluminum, or other metal or metal alloy. The arrays of particles can have a square, rectangular, or spiral pattern, or can have another periodic, regular pattern, or an aperiodic, irregular pattern. The geometric shape of the metal particles can be spherical, spheroidal, rod-like, polygonal, or can irregular, and can be solid or hollow nanostructures. The metal particles can have at least one dimension in a range of up to about 200 nm, up to about 180 nm, up to about 160 nm, up to about 140 nm, up to about 120 nm, up to about 100 nm, up to about 80 nm, or up to about 60 nm, and down to about 10 nm, down to about 5 nm, or down to about 1 nm. The metal layer 330 is adjacent at least a portion of the phase change material layer 340. For example, the metal layer 330 can be disposed over the phase change materials layer 340, as shown in FIG. 17a, under the phase change material layer 340, as shown in FIG. 17b, or between two phase change material layers 340, as shown in FIG. 17c. In FIG. 17c, the top and bottom phase change material layers 340 can include the same phase change material or different phase change materials. The metal layer 330 and the one or more phase change material layers 340 are disposed over the substrate 350. The substrate 350 can be a semiconductor substrate, such as a silicon substrate, or an insulator substrate, such as a glass substrate.

The optical switching devices 300, 310, and 320 can be reversibly switched between states of different optical transmittance to achieve a light blocking or filtering function, or between states of different refractive index to tune resonances of the metal layer 330. An electrical source 350 can be connected to the phase change material layer 340 to apply a voltage bias (or other electrical stimulus) in order to switch the states of the phase change materials.

EXAMPLES

The following examples describe specific aspects of some embodiments of this disclosure to illustrate and provide a description for those of ordinary skill in the art. The examples should not be construed as limiting this disclosure, as the examples merely provide specific methodology useful in understanding and practicing some embodiments of this disclosure.

Example 1

Phase Transformations Induced by Strain or Stress

Computational Details: DFT and hybrid DFT calculations were performed using the Projector-Augmented Wave (PAW) pseudopotential implementation of the Vienna Ab Initio Simulation Package (VASP), version 5.3. In the DFT calculations, electron exchange and correlation effects are described by the GGA functional of Perdew, Burke and Ernzerhof (PBE). Wave functions are expanded in a plane-wave basis set with a kinetic energy cutoff of 350 eV on an 18×18×1 Monkhorst-Pack k-point grid using a Gaussian smearing of 50 meV. The convergence thresholds were $0.5 \cdot 10^{-6}$ eV/MX$_2$ and $0.5 \cdot 10^{-5}$ eV/MX$_2$ for electronic and ionic relaxations, respectively. The linear-response phonon calculations use an electronic threshold of $0.5 \cdot 10^{-8}$ eV/MX$_2$. The Hybrid DFT calculations employ the screened hybrid functional by Heyd, Scuseria and Ernzerhof (HSE06). The electronic convergence threshold used for HSE06 calculations is $0.5 \cdot 10^{-5}$ eV/MX$_2$. A total of 26 valence electrons per MX$_2$ are treated by HSE06 whereas the PBE calculations treat 18 valence electrons. The Lagrange interpolation used to calculate forces and stresses for the load-specific trajectories was carried out on a 6×6 grid instead of the usual 7×7 grid, leaving out the highest-strain points.

Computational unit cells of the 1T' structure (shown in FIG. 1) possess reflection symmetry around the x=0 and x=a/2 axes. This symmetry seems to be present or very slightly broken in experimental data. Moreover, phonon analysis of this unit cell indicates that this reflection symmetry is stable under ambient conditions. 1T' energies and intersection contours are calculated, such as in FIG. 3, using computational cells with the same numbers of atoms to allow description of potentially lower-symmetry 1T' cells, but all except the highest-strain cases reverted to the x=0 and x=a/2 symmetric case when the atoms were allowed to relax within the strained unit cell. It is found that the 2H-1T' intersection contours were virtually unaltered after allowing for broken symmetry.

Example 2

Phase Transformations Induced by Electrostatic Gating

Electronic structure calculation: DFT calculations were performed using the projector augmented-wave pseudopotential implementation of the VASP, version 5.3.3. In the DFT calculations, electron exchange and correlation effects are described by the GGA functional of PBE. Wave functions are expanded in a plane-wave basis set with a kinetic energy cutoff of 350 eV on an 18×18×1 Monkhorst-Pack k-point grid using a Gaussian smearing of 50 meV. Calculations were performed at 0 K. The convergence thresholds were 0.5×10$^{-8}$ eV per MX$_2$ and 0.5×10$^{-7}$ eV per MX$_2$ for electronic and ionic relaxations, respectively.

Total energy of a charged monolayer: In an Ab initio simulation of a charged monolayer, a homogeneous background charge is automatically introduced in the vacuum space in order to compensate the excess charge so that the periodic computational cell remains electrically neutral. To obtain the total energy of a charged monolayer, corrections are performed to subtract the interaction between the electrons in the monolayer and the background charge. Also, to have the electron chemical potential fixed, a reference state is chosen, which is assigned zero energy and where the electron is placed after being removed from the monolayer. This reference state works as an electron reservoir and is placed in the middle of two periodic monolayers, namely the computational cell boundary. Therefore, half of the computational cell length in the vacuum direction equals the separation between the middle of the monolayer and the electron reservoir surface.

Ab initio simulation of a charged monolayer: In order to simulate a charged monolayer, a predetermined number of excess electrons ($n_e$) are added to the system. $n_e$ is negative if electrons are removed from the system. The electric charge of the monolayer is $q=-n_e e$, where e is the elementary electric charge. The homogeneous background charge is $q_{bg}=-q=n_e e$, and the charge density is $\rho_{bg}=q_{bg}/\Omega$, where $\Omega$ is the computational cell volume.

The self-consistent energy obtained by ab initio calculations $E_{scf}$ is corrected for the interaction between the electrons in the monolayer and the background charge. $E_{scf}$ can be described as:

$$E_{scf}=E_{mo}+E_{mo-bg}+E_{bg} \quad (6)$$

where $E_{mo}$ is the energy of the monolayer without the background charge, $E_{mo-bg}$ is the interaction energy between the monolayer and background charge, and $E_{bg}$ is the energy of the background charge without the monolayer. Decoupling the interaction between the monolayer and background charge essentially involves subtracting the second and third terms in equation (6), which can be represented as:

$$\begin{cases} E_{mo-bg} = \int_\Omega \rho_{bg}(\vec{r})V_{mo}(\vec{r})d\vec{r} = q_{bg}<V_{mo}(\vec{r})> \\ E_{mo-bg} = \frac{1}{2}\int_\Omega \rho_{bg}(\vec{r})V_{bg}(\vec{r})d\vec{r} = \frac{1}{2}q_{bg}<V_{bg}(\vec{r})> \end{cases} \quad (7)$$

where $V_{mo}$ is the monolayer potential, and $V_{bg}$ is the background potential. The reference state for the potential is chosen to be in the middle of two periodic monolayers, which means the electron reservoir is placed at the computational cell boundary in the vacuum direction.

From equations (6) and (7), the monolayer energy can be obtained as:

$$\begin{aligned} E_{mo} &= E_{scf} - (E_{mo-bg}+E_{bg}) \quad (8) \\ &= E_{scf} - q_{bg}<V_{tot}(\vec{r})> + \frac{1}{2}q_{bg}<V_{bg}(\vec{r})> \\ &= E_{scf} - n_e e<V_{tot}(\vec{r})> + \frac{1}{2}n_e e<V_{bg}(\vec{r})> \end{aligned}$$

where $V_{tot}=V_{mo}+V_{bg}$ is the total potential.

In addition to the dependence on the number of excess electrons $n_e$ shown in equation (8), the monolayer energy $E_{mo}$ also depends on the computational cell length in the vacuum direction L; therefore $E_{mo}=E_{mo}(n_e, L)$. The second-order polynomial fitting of the ab initio result was performed using linear least squares regression method in order to obtain the analytical expression for $E_{mo}(n_e, L)$.

Because electronic structure calculations were performed at zero temperature, the Helmholtz free energy F should be the same as total energy $E_{mo}$. Therefore, the electron chemical potential µ can be represented as:

$$\mu(n_e, L) = \frac{\partial E_{mo}(n_e, L)}{\partial n_e} \qquad (9)$$

and the grand potential $\Phi_G$ can be represented as:

$$\Phi_G(n_e,L)=E_{mo}(n_e,L)-\mu(n_e,L)n_e \qquad (10)$$

Figure 18:
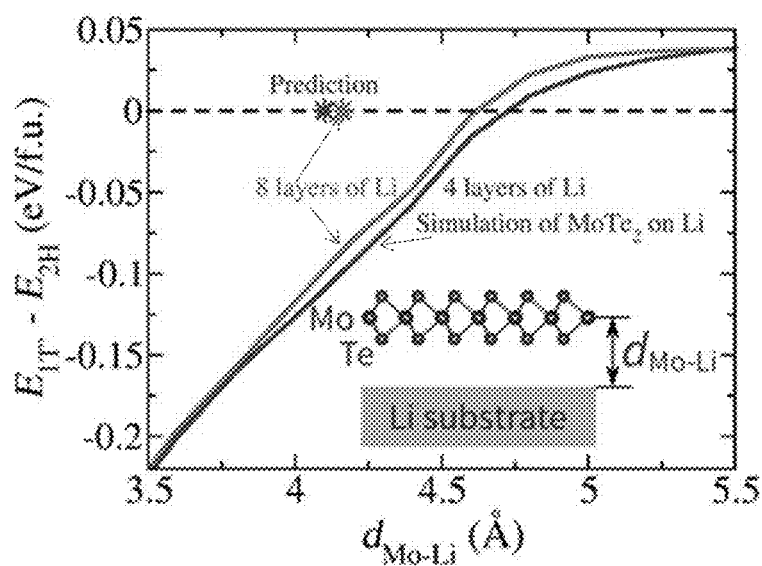
FIG. 18: Validation of the total energy calculation for a charged monolayer. Plotted is the energy difference between 2H-MoTe$_2$ placed on a Li substrate and 1T'-MoTe$_2$ on the same substrate. The energy difference changes with respect to the separation between the center of monolayer MoTe$_2$ and the substrate surface $d_{Mo-Li}$. Upper and lower solid lines are the DFT simulation results of monolayer MoTe$_2$ on 4-layer and 8-layer Li substrates, respectively. The Li substrate is constrained into the computation cell of relaxed 2H-MoTe$_2$. The two star points are the predictions of the analytical expressions of total energy obtained by interpolation and fitting. These predictions use the work functions of strained 4-layer and 8-layer substrates calculated in DFT separately.

Validation of the total energy calculation for a charged monolayer: In the previous section, the approach of determining the analytical expression for the monolayer energy $E_{mo}$, the electron chemical potential µ, and the grand potential $\Phi_G$ was explained. To validate the approach, simulation was performed of a system of a monolayer $MoTe_2$ placed on a Li substrate. The energetics of 2H-$MoTe_2$ and 1T'-$MoTe_2$ will change with respect to the separation between the center of the monolayer and the substrate surface $d_{Mo-Li}$. In ab initio simulations, by fixing the Mo atoms in z direction (perpendicular to the monolayer plane), a plot can be made of the energy difference of 1T'-$MoTe_2$ placed on the Li substrate and 2H-$MoTe_2$ on the Li substrate (solid lines in FIG. 18). FIG. 18 shows that, far away from the substrate, 2H-$MoTe_2$ has a minimized energy and is energetically favorable, and this is consistent with the observation that the equilibrium state of a free-standing $MoTe_2$ monolayer is the 2H phase. However, when the monolayer is pushed towards the Li substrate close enough, 1T'-$MoTe_2$ will have a lower energy and becomes thermodynamically stable. The transition separation $d_{Mo-Li}$ at which 2H-$MoTe_2$ and 1T'-$MoTe_2$ have the same energy equals about 4.7 Å for a substrate of 4 Li layers (lower line) and about 4.6 Å for a substrate of 8 Li layers (upper line). Using the analytical expressions obtained for $E_{mo}$, µ, and $\Phi_G$, a prediction can be made of the transition separation, given the condition that the electron chemical potential equals the negative of the work function of the substrate. The prediction result is about 4.10 Å using the work function of a substrate of 4 Li layers (right star), and about 4.16 Å using the work function of a substrate of 8 Li layers (left star). These prediction results are reasonably comparable to the simulation results. The difference may because the substrate of a few Li layers is not an ideal electron reservoir, indicated by the observation that increasing the number of Li layers would reduce the error between the simulation and prediction results.

Figure 19:
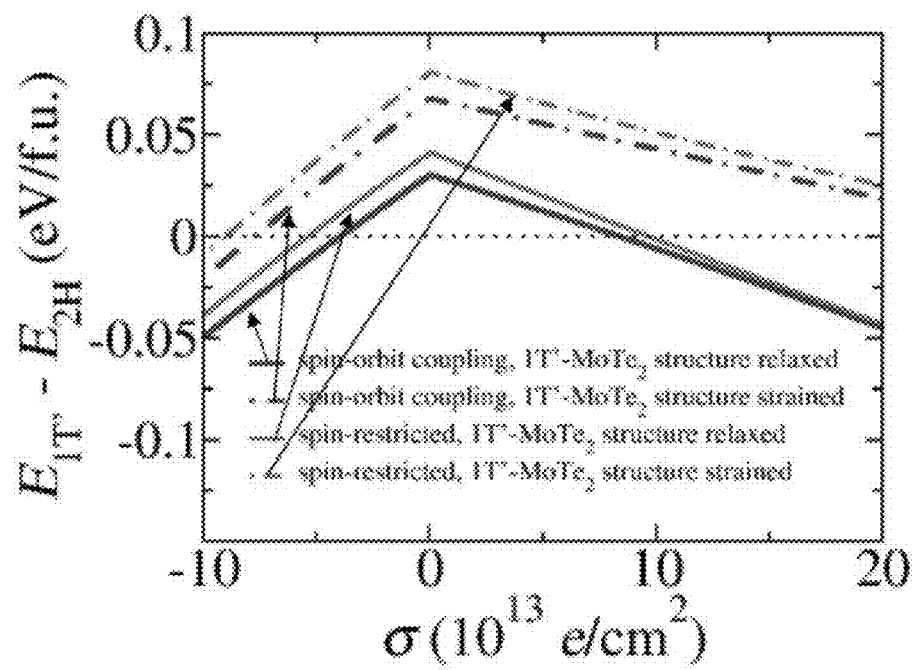
FIG. 19: Spin-orbit coupling effect. The energy difference between 2H-MoTe$_2$ and 1T'-MoTe$_2$ $E_{1T'}$-$E_{2H}$ changes with respect to charge density σ. The solid lines are the result of structurally relaxed 2H and 1T' phases (stress free). The dashed lines are the energy differences between the structurally relaxed 2H phase and the strained 1T' phase, which is constrained to the computation cell of the same lattice constant of the relaxed 2H phase. It's assumed that the separation between the surface of MoTe$_2$ and the electron reservoir equals about 3 Å. Compared to the spin-restricted calculation, the spin-orbit coupling will render it easier to induce the phase transition from 2H to 1T'.

Spin-orbit coupling effect: Band splitting due to spin-orbit coupling can play a role in the electronic calculations of TMDs. In FIG. 19, the energy differences between 2H-$MoTe_2$ and 1T'-$MoTe_2$ as a function of the charge density are compared between spin-orbit coupling-included calculations and spin-restricted calculations. FIG. 19 shows that the inclusion of spin-orbit coupling effect would lower the threshold charge density for the phase transition.

Figure 20:
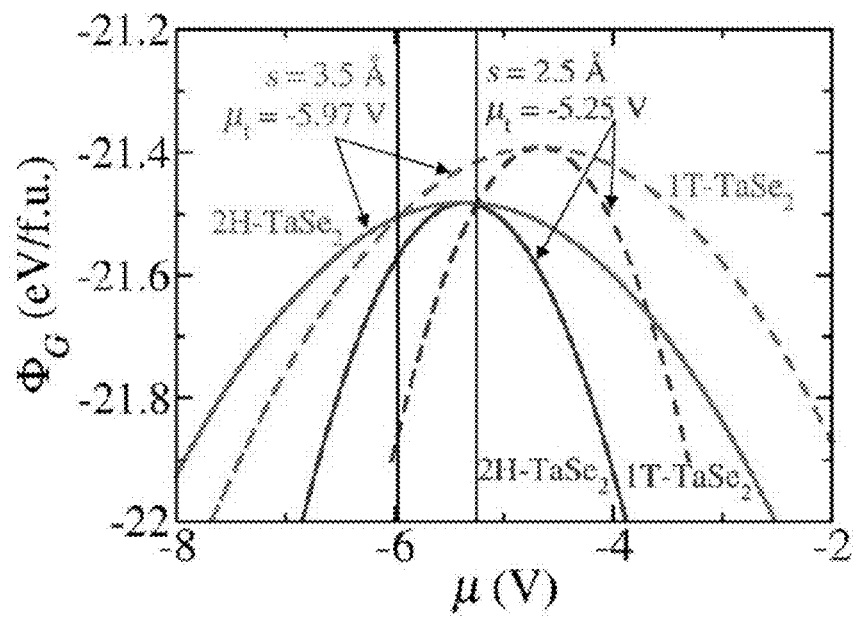
FIG. 20: Phase boundary at constant voltage (monolayer TaSe$_2$). The grand potential $\Phi_G$ changes with respect to the electron chemical potential μ of the monolayer. It's assumed that the separation between the surface of monolayer TaSe$_2$ and the electron reservoir s equals about 2.5 Å and about 3.5 Å. 2H-TaSe$_2$ has a lower grand potential and is the equilibrium phase when the electron chemical potential is larger than the transition potential $\mu_t$; otherwise 1T-TaSe$_2$ becomes the more thermodynamically stable phase. An increased separation s would result in a more negative transition chemical potential $\mu_t$.

Phase boundary of monolayer $TaSe_2$ at constant voltage: Similar to the phase boundary of monolayer $MoTe_2$ and $MoS_2$ at constant voltage plotted in FIG. 10, the phase boundary of monolayer $TaSe_2$ is plotted in FIG. 20. FIG. 20 shows that increasing the separation between the monolayer and the electron reservoir would increase the negative threshold transition potential.

Vacuum electronic states: When excess electrons are assigned to the computation cell, a homogeneous positive background charge is automatically introduced in the vacuum space in order to compensate the excess charge. When the number of excess electrons is increased to some value and the vacuum separation in the direction perpendicular to the monolayer surface is greater than some threshold, vacuum electronic states of lower energy will form in the center of two periodic monolayers, namely the boundary of the computation cell. To avoid the formation of these vacuum electronic states, one can either reduce the number of excess electrons or decrease the vacuum separation.

Example 3

Energy Efficiency of Electrically-Driven Phase Transformation

In this example, computation is performed of a minimum amount of energy to electrically drive a phase transformation in 2D $MoTe_2$ and $MoS_2$. Next, the results are compared with an energy consumption of a phase transformation in $Ge_2Sb_2Te_5$ (GST), which is a phase change material used in phase change memories. The results show that the phase transformation in $MoTe_2$ involves about eight times less energy than the phase transformation in GST.

Figure 21:
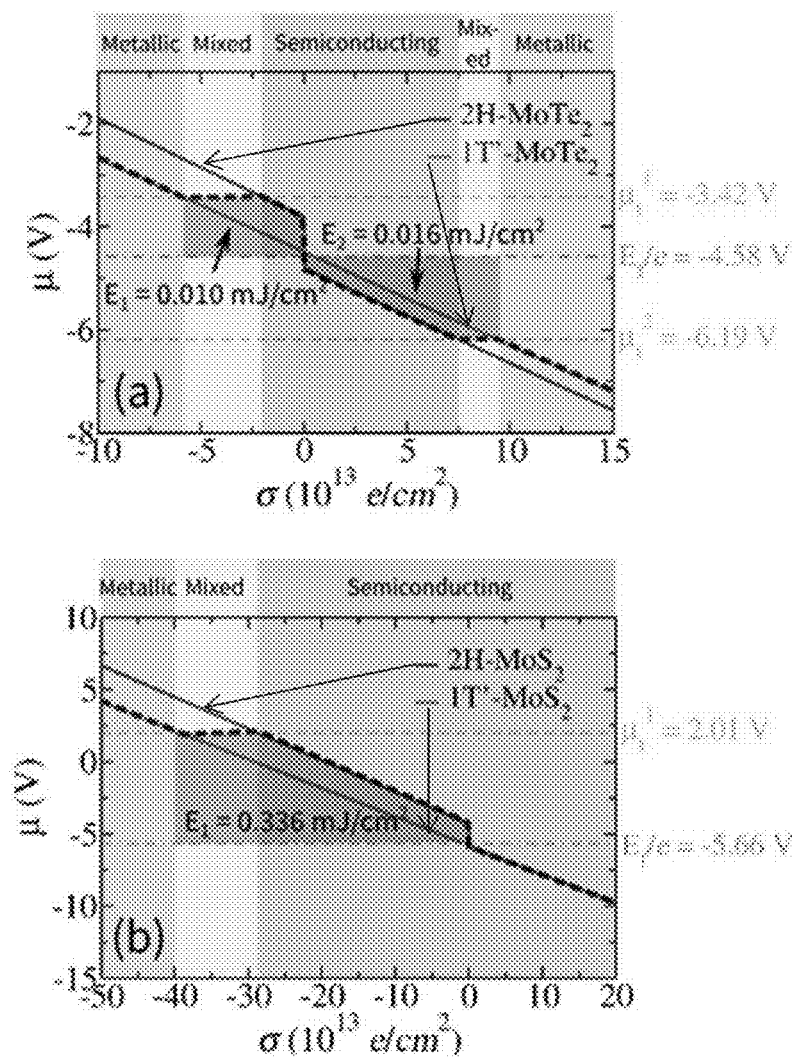
FIG. 21: (a) and (b) Electron chemical potential versus surface carrier density, obtained from DFT calculations. (a) is for $MoTe_2$, and (b) is for $MoS_2$. Top and bottom horizontal dashed lines are transition electron chemical potentials for phase transformation to occur. Middle horizontal dashed line displays the transition route from semiconducting 2H phase to mixed phase and to metallic 1T' phase. Shadowed region represents the energy to drive the phase transformation.

Based on calculation results using DFT, the electron chemical potential µ is plotted with respect to carrier density σ in monolayer $MoTe_2/MoS_2$ for both semiconducting 2H phase and metallic 1T' phase, as shown in FIG. 21. For $MoTe_2$ in FIG. 21a, DFT results predict two transition electron chemical potentials $\mu_t^1=-3.42$ V and $\mu_t^2=-6.19$ V (top and bottom horizontal dashed lines). Between these two lines, semiconducting 2H-$MoTe_2$ is thermodynamically more stable; outside these two transition values, metallic 1T'-$MoTe_2$ has a lower free energy and is the equilibrium phase. On these two transition lines, the monolayer is a mixed phase of semiconducting 2H structure and metallic 1T' structure. In the mixed phase, a carrier density will change, while electron chemical potential will stay the same. Middle horizontal dashed line is the Fermi level $E_f$ of neutral 2H-$MoTe_2$. Hence the area of the shadowed region $\Delta\sigma\mu$ is the energy consumption to electrically drive a semiconductor-to-metal phase transition in monolayer $MoTe_2$. For negatively charged-driven phase transition, the energy consumption is at least about $E_1=0.010$ mJ/cm$^2$; for positively charged-driven phase transition, the energy consumption is at least about $E_2=0.016$ mJ/cm$^2$. The same calculation is performed for $MoS_2$, and the energy consumption is at least about $E_1=0.336$ mJ/cm$^2$.

The minimum amount of energy to melt and reset a GST bit is $E_{min}=1.2$ aJ/nm$^3$. To compare the energy density calculated above with the energy consumption of GST, the calculated density is converted to three dimensions by dividing by the interlayer distance of $MoTe_2$ and $MoS_2$, which is about 6.984 Å and about 6.147 Å, respectively. After conversion, the minimum energy to drive the phase transformation in $MoTe_2$ is about $E_1=0.143$ aJ/nm$^3$ and about $E_2=0.229$ aJ/nm$^3$ for negatively charged-driven and positively charged-driven, respectively (Table I). For $MoS_2$, the minimum energy is about $E_1=4.811$ aJ/nm$^3$. As can be observed from Table I, the negatively charged-driven phase transformation in $MoTe_2$ involves energy about eight times smaller than the phase transformation in GST, indicating that $MoTe_2$ is a phase change material with higher energy efficiency than GST.

TABLE I

Minimum amount of energy to drive phase transformation in MoTe$_2$, MoS$_2$ and GST. $E_{min}^{2D}$ is the energy density in two dimensions, and $E_{min}^{3D}$ is the energy density in three dimensions.

| Materials | $E_{min}^{2D}$ (mJ/cm$^2$) | $E_{min}^{3D}$ (aJ/nm$^3$) |
|---|---|---|
| MoTe$_2$ (neg.) | 0.010 | 0.143 |
| MoTe$_2$ (pos.) | 0.016 | 0.229 |
| MoS$_2$ | 0.336 | 4.811 |
| Ge$_2$Sb$_2$Te$_5$ (GST) | — | 1.2 |

As used herein, the singular terms "a," "an," and "the" include plural referents unless the context clearly dictates otherwise. Thus, for example, reference to an object can include multiple objects unless the context clearly dictates otherwise.

As used herein, the terms "connect," "connected," "connecting," and "connection" refer to an operational coupling or linking. Connected objects can be directly coupled to one another or can be indirectly coupled to one another, such as through another set of objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations is not a limitation of the disclosure.

What is claimed is:

1. An electronic or optoelectronic device, comprising:
a layer of a transition metal dichalcogenide; and
a pair of electrodes connected to the layer of the transition metal dichalcogenide,
wherein the device is a transistor device, the pair of electrodes corresponds to a source electrode and a drain electrode, the transistor device includes a channel connected between the source electrode and the drain electrode, the channel includes the layer of the transition metal dichalcogenide, and the transistor device further includes a gate electrode connected to and in direct contact with the layer of the transition metal dichalcogenide.

2. The device of claim 1, wherein the gate electrode is configured to apply an electrical stimulus to the layer of the transition metal dichalcogenide to induce a phase transformation of at least a region of the layer of the transition metal dichalcogenide.

3. The device of claim 1, wherein the transition metal dichalcogenide is selected from at least one of MoTe$_2$, MoSe$_2$, MoS$_2$, WTe$_2$, WSe$_2$, WS$_2$, alkali metal-doped MoTe$_2$, alkali metal-doped MoSe$_2$, alkali metal-doped MoS$_2$, alkali metal-doped WTe$_2$, alkali metal-doped WSe$_2$, or alkali metal-doped WS$_2$.

4. The device of claim 2, wherein the phase transformation is a transformation between semiconducting and metallic phases of the transition metal dichalcogenide.

5. The device of claim 4, wherein the semiconducting and metallic phases correspond to different crystal structures of the transition metal dichalcogenide.

6. The device of claim 2, further comprising an electrical source connected to the gate electrode and configured to apply a bias voltage having a magnitude of at least 1 V.

7. The device of claim 2, further comprising an electrical source connected to the gate electrode and configured to apply a bias voltage having a magnitude in a range of 0.5 V to 1 V.

8. The device of claim 1, wherein the transition metal dichalcogenide is selected from at least one of alkali metal-doped MoTe$_2$, alkali metal-doped MoSe$_2$, alkali metal-doped MoS$_2$, alkali metal-doped WTe$_2$, alkali metal-doped WSe$_2$, or alkali metal-doped WS$_2$.

9. The device of claim 1, further comprising a metal substrate, and wherein the layer of the transition metal dichalcogenide is in direct contact with the metal substrate.

10. The device of claim 1, further comprising a semiconductor substrate, and wherein the layer of the transition metal dichalcogenide is in direct contact with the semiconductor substrate.

* * * * *